United States Patent
Kanaya

(12) United States Patent (10) Patent No.: US 7,504,684 B2
Kanaya (45) Date of Patent: Mar. 17, 2009

(54) SEMICONDUCTOR DEVICE AND MANUFACTURING METHOD THEREFOR

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 467 days.

(21) Appl. No.: 11/291,837

(22) Filed: Dec. 2, 2005

(65) Prior Publication Data

US 2007/0077721 A1 Apr. 5, 2007

(30) Foreign Application Priority Data

Sep. 30, 2005 (JP) .............................. 2005-286214

(51) Int. Cl.
*H01L 27/108* (2006.01)

(52) U.S. Cl. .................. 257/300; 257/295; 257/296; 257/306; 257/310; 438/239; 438/240

(58) Field of Classification Search ......... 257/295–296, 257/300, 306, 310; 438/239, 240
See application file for complete search history.

(56) References Cited

U.S. PATENT DOCUMENTS

| | | | |
|---|---|---|---|
| 6,188,098 B1 * | 2/2001 | Amanuma | 257/306 |
| 6,781,184 B2 * | 8/2004 | Solayappan et al. | 257/310 |
| 6,906,908 B1 * | 6/2005 | Yabuki et al. | 361/312 |
| 6,952,364 B2 * | 10/2005 | Lee et al. | 365/158 |
| 7,064,374 B2 * | 6/2006 | Solayappan et al. | 257/310 |
| 7,141,438 B2 * | 11/2006 | Ha et al. | 438/3 |
| 7,344,939 B2 * | 3/2008 | Eliason et al. | 438/240 |
| 2001/0034106 A1 * | 10/2001 | Moise et al. | 438/396 |
| 2003/0173677 A1 * | 9/2003 | Yang et al. | 257/758 |
| 2005/0205910 A1 | 9/2005 | Kumura et al. | |

FOREIGN PATENT DOCUMENTS

| | | |
|---|---|---|
| JP | 7-111318 | 4/1995 |
| JP | 7-273297 | 10/1995 |
| JP | 8-335673 | 12/1996 |

* cited by examiner

*Primary Examiner*—Zandra Smith
*Assistant Examiner*—Bac H Au
(74) *Attorney, Agent, or Firm*—Oblon, Spivak, McClelland, Maier & Neustadt, P.C.

(57) ABSTRACT

A semiconductor device comprising a capacitive element which is provided above the semiconductor substrate and which has a capacitive insulation film held between an upper electrode and a lower electrode, a conductor for upper electrode which is connected to the upper electrode, a side-wall adsorbent member which covers a side wall of the conductor for upper electrode and which is composed of a material that adsorbs at least hydrogen, a conductor for lower electrode which is connected to the lower electrode, and a first adsorbent member which is provided at least either between the conductor for upper electrode and the capacitive insulation film or between the conductor for lower electrode and the capacitive insulation film, and which is composed of a material that adsorbs at least hydrogen.

13 Claims, 15 Drawing Sheets

SEMICONDUCTOR DEVICE AND MANUFACTURING METHOD THEREFOR

CROSS-REFERENCE TO RELATED APPLICATIONS

This application is based upon and claims the benefit of priority from prior Japanese Patent Application No. 2005-286214, filed Sep. 30, 2005, the entire contents of which are incorporated herein by reference.

BACKGROUND OF THE INVENTION

1. Field of the Invention

The present invention relates to a semiconductor device equipped with a capacitive element and its manufacturing method, and more specifically, to a semiconductor device equipped with a capacitive element with degradation of a capacitance insulation film caused by hydrogen suppressed and its manufacturing method.

2. Description of the Related Art

A manufacturing process of a semiconductor device is divided roughly into a so-called front end of the line (FEOL) in which various semiconductor elements are provided on a semiconductor substrate and a so-called back end of the line (BEOL). For example, capacitive elements (capacitors) mounted to semiconductor memory, etc. are formed in the front end of the line (FEOL).

Now, in a capacitor which has a general construction with a capacitive insulation film (capacitor insulation film) held between upper and lower electrodes, the capacitor insulation film is easy to come in contact with hydrogen or is susceptible to invasion of hydrogen in the capacitor insulation film. At the same time, in general, insulators used for a capacitor insulation film are likely to be formed by material susceptible to damage when it comes in contact with hydrogen or when hydrogen invades the inside. In addition, the condition in which hydrogen comes in contact with the capacitor insulation film or hydrogen invades the capacitor insulation film inside frequently occurs in the process associated with hydrogen. And the process accompanied by hydrogen is, in general, included in the back end of the line (BEOL). That is, in the back end of the line (BEOL) after the capacitor has once been formed, the condition in which the capacitor insulation film is susceptible to damage by hydrogen occurs.

When the capacitor insulation film is damaged by hydrogen, the film quality is deteriorated and the electric characteristics of capacitor are degraded. As a result, performance, reliability, quality, etc. of a semiconductor memory are degraded. And these influences of damage caused by hydrogen are more strongly exhibited in a ferroelectric film than a regular insulation film. That is, when the ferroelectric film is damaged by hydrogen, the ferroelectric properties are markedly degraded. Consequently, for example, when the ferroelectric film is damaged by hydrogen in ferroelectric random access memory (FeRAM), which is equipped with ferroelectric capacitors whose capacitor insulation film is formed by ferroelectric substances, electric properties of ferroelectric capacitors are markedly degraded. As a result, performance, reliability, quality, etc. are markedly degraded.

In order to prevent degradation of ferroelectric characteristics of a ferroelectric film by hydrogen as described above, several constructions to block hydrogen for a capacitor insulation film has been proposed. Such a construction is called, for example, a hydrogen barrier construction, etc.

For example, in the technique disclosed in Jpn. Pat. Appln. KOKAI Publication No. 7-273297, the ferroelectric capacitor has surfaces covered with a hydrogen barrier film, except for connections (contact section) between the upper electrode and the contact plug for upper electrode and the main surface (lower surface of lower electrode) on the side connected to the contact plug for lower electrode. However, with this construction, the surface of the contact plug for upper electrode is not covered with the hydrogen barrier film. Furthermore, no hydrogen barrier film is provided between the upper electrode and the contact plug for upper electrode. Consequently, with this configuration, it is extremely difficult to block hydrogen which intends to intrude (mix) into the ferroelectric capacitor inside via a contact hole for upper electrode when a contact plug for upper electrode is provided in the contact hole for upper electrode in the back end of the line after the ferroelectric capacitor has been formed in the manufacturing process. Consequently, in the back end of the line, the capacitor insulation film is susceptible to damage by hydrogen.

In this way, with the hydrogen barrier construction proposed to date, it has been difficult to satisfactorily prevent damage of hydrogen to the capacitor film not only when the capacitor insulation film is formed with ferroelectric substance but also when the capacitor insulation film is formed by regular insulation material.

BRIEF SUMMARY OF THE INVENTION

According to an aspect of the invention, there is provided a semiconductor device comprising: a capacitive element which is provided above the semiconductor substrate and which has a capacitive insulation film held between an upper electrode and a lower electrode; a conductor for upper electrode which is connected to the upper electrode; a side-wall adsorbent member which covers a side wall of the conductor for upper electrode and which is composed of a material that adsorbs at least hydrogen; a conductor for lower electrode which is connected to the lower electrode; and a first adsorbent member which is provided at least either between the conductor for upper electrode and the capacitive insulation film or between the conductor for lower electrode and the capacitive insulation film, and which is composed of a material that adsorbs at least hydrogen.

According to another aspect of the invention, there is provided a manufacturing method of a semiconductor device, comprising: providing a conductor for lower electrode above a semiconductor substrate; providing a lower electrode which connects to the conductor for lower electrode; providing a capacitive insulation film on the lower electrode; providing an upper electrode on the capacitive insulation film; providing a conductor for upper electrode which connects to the upper electrode; providing a side-wall adsorbent member which covers a side wall of the conductor for upper electrode and which is composed of a material that adsorbs at least hydrogen; and providing a first adsorbent member which is composed of a material that adsorbs at least hydrogen at least either between the conductor for upper electrode and the capacitive insulation film or between the conductor for lower electrode and the capacitive insulation film.

DETAILED DESCRIPTION OF THE INVENTION

Figure 1:
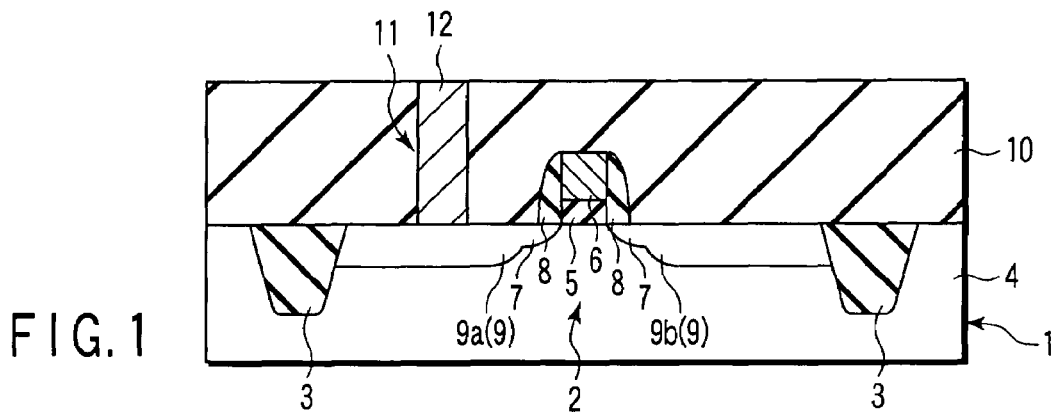
FIG. 1 is a cross-sectional process diagram that indicates a manufacturing method of a semiconductor device according to a first embodiment.

Referring now to the drawings, each embodiment according to the invention will be described in detail as follows.

First Embodiment

First of all, a first embodiment according to the invention will be described with reference to FIGS. 1 to 6. FIGS. 1 to 6 are cross-sectional process diagrams which indicate a manufacturing method of a semiconductor device according to the embodiment, respectively.

In the present embodiment, there are described a capacitor and its manufacturing method, which can block hydrogen for the capacitor insulation film by achieving the capacitive element (capacitor) construction to be of a construction in which hydrogen is difficult to reach the capacitive insulation film (capacitor insulation film) and whose capacitor insulation film is difficult to be susceptible to damage by hydrogen in the process so-called back end of the line (BEOL) after the capacitor forming process. As a result, a semiconductor device, which is equipped with such a capacitor and its manufacturing method, will be described. In particular, in the present embodiment, the capacitor insulation film is formed by the use of ferroelectric substance and at the same time, the description will be made on the ferroelectric capacitor whose capacitor insulation film has a construction which is difficult to be damaged by hydrogen and its manufacturing method. As a result, the description will be made on a ferroelectric memory unit (ferroelectric random access memory: FeRAM) equipped with such a ferroelectric capacitor and the manufacturing method thereof.

Specifically, the capacitor insulation film is formed by the use of a ferroelectric substance and a ferroelectric capacitor is fabricated. In addition, an insulative hydrogen barrier film is arranged between the upper electrode and a contact for the upper electrode eclectically connected to this. Thereby, hydrogen which intends to invade the capacitor insulation film via the contact of upper electrode is blocked for the capacitor insulation film and fear of hydrogen damaging the capacitor insulation film in the back end of the line (BEOL) is suppressed or reduced. As a result, degradation of film quality and electrical properties of the capacitor insulation film arising from damage which the capacitor insulation film receives from hydrogen and degradation, etc. of electrical properties of the whole ferroelectric capacitor is suppressed or reduced. Now, this is described more in detail as follows.

First of all, as shown in FIG. 1, a switching transistor 2 is provided on the surface layer section of a semiconductor substrate 1 such as a silicon wafer, etc. Specifically, oxides such as $SiO_2$, etc. which are insulation materials are embedded on the outside in such a manner to surround the region in which the switching transistor 2 is provided of the surface layer section of the silicon wafer (Si substrate) 1. Thereby, an element separation region 3 comprising a so-called shallow trench isolation (STI) structure is formed on the surface layer section of the Si substrate 1.

Then, in a region, which includes the region surrounded by the element separation region 3 of the surface section of Si substrate 1, impurities (dopant) comprising a predetermined conductivity type are introduced by an ion implantation method and heat-treated. In this case, n-type impurities are implanted when the conductivity type of the Si substrate 1 is p-type. For n-type impurities, for example, pentavalent elements such as arsenic (As), phosphorus (P), and others are used. In addition, when the conductivity type of the Si substrate 1 is n-type, p-type impurities are implanted. For p-type impurities, for example, trivalent elements such as boron (B), indium (In), and others are used. Thereby, in a region including the region surrounded by the element separation region 3 of the surface layer section of the Si substrate 1, a well 4, which has n-type or p-type conductivity type, is formed. Together with this, in the region surrounded by the element separation region 3 of the surface layer section of the Si substrate 1, a channel region not illustrated of the switching transistor 2 is formed.

Continuously, to cover the surface of the Si substrate 1 with the well 4 and the channel region formed, an insulation film 5 such as a $SiO_2$ film, etc. is provided by the MOCVD method, etc. The insulation film 5 serves as a gate insulation film of the switching transistor 2. Continuously, to cover the surface of the $SiO_2$ film 5, a film 6 made of a polycrystal silicon based material such as a polysilicon (poly-Si) film, etc. is formed. These polycrystal silicon based film 6 serves as a gate electrode of the switching transistor 2. Then, the silicon film 6 and $SiO_2$ film 5 are respectively formed into predetermined shapes by using lithography, RIE method, etc., and the gate electrode 6 and the gate insulation film 5 are formed. The gate electrode 6 becomes a word line.

Continuously, impurities comprising the predetermined conductivity type are introduced into the inside of the gate electrode 6 and the surface layer section of the well 4 by the ion implantation method. However, the impurities introduced in this case shall be the impurities having the conductivity type opposite to those of the impurities introduced hen the well 4 is formed. Thereafter, the gate electrode 6 and the well 4 with impurities introduced are annealed by the rapid thermal anneal (RTA) method, etc. Consequently, impurities are substantially uniformly diffused inside the gate electrode 6 and in the surface layer section of the well 4 and activated. In addition, recovery from damage caused by impurities introduced to the gate electrode 6 and the surface layer section of the well 4 is carried out. As a result, an extension region (shallow joint region) 7 which serves as electrical connections between each diffused region of source and drain of the switching transistor 2 and the channel not illustrated is formed on the surface layer section of the well 4.

Next, a gate-side wall film 8 composed of an insulation film such as a $SiO_2$ film, etc. is formed by the etchback method, etc. in such a manner to cover the gate electrode 6 and the side portion of the gate insulation film 5. Then, by the ion implantation method, other impurities having the same conductivity type as that of the impurities introduced to the inside of the gate electrode 6 and the surface layer portion of the well 4 are introduced into the surface layer portion of the well 4 with the extension region 7 formed. Continuously, annealing treatment is provided to the surface layer portion of the well 4 with other impurities implanted by using the spike anneal method, etc. Consequently, in the surface layer portion of the well 4, other impurities can be diffused substantially uniformly to the deeper position than the extension region 7 and are activated. In addition, recovery from damage caused by impurities implanted of the surface layer section of the well 4 is carried out.

As a result, a contact region (deep joint region) 9 which serves as each diffused region 9a, 9b of source and drain of the switching transistor 2 is practically integrated with the extension region 7 and formed on the surface layer section of the well 4. That is, a pair of source diffused region (source diffused layer) 9a and drain diffused region (drain diffused layer) 9b comprising a lightly doped drain (LDD) construction are formed on the surface layer portion of the Si substrate 1. Thereafter, illustrations and detailed description will be omitted, but the regular salicide process, etc. are carried out. As a result, as shown in FIG. 1, the MOSFET 2 as the switching transistor is provided on the surface layer portion of the Si substrate 1.

Then, as shown in FIG. 1, the first layer inter level dielectric (ILD) film 10 is provided as the low layer side interlayer insulation layer which covers the surface of the Si substrate 1 with the MOSFET 2 provided. This first layer inter level dielectric film 10 is formed by forming, for example, the $SiO_2$ film, etc. by the CVD process. Continuously, at least either above the source diffusion region 9a of the MOSFET 2 or the drain diffusion region 9b, a lower electrode contact hole 11 is formed by penetrating the first layer inter level dielectric film 10 along the film thickness direction. In the present embodiment, in at least one place above the source diffusion region 9a, the lower electrode contact hole 11 is formed and the surface of the source diffusion region 9a is exposed. The lower electrode contact hole 11 is formed by anisotropic etching such as dry etching, etc. Then, for example, aluminum (Al) and copper (Cu), or tungsten (W) and other conducting material 12 are embedded inside the lower electrode contact hole 11 by using the CVD process and CMP process. Consequently, at least one lower electrode conductor 12 is electrically connected to the source diffusion region 9a and provided in the first layer inter level dielectric film 10. The lower electrode conductor 12 becomes the lower electrode contact plug to be electrically connected to the lower electrode 13 of the capacitive element 16 later discussed.

When the lower electrode contact plug 12 is formed by Cu, in general, the surface of the lower electrode contact plug 12 is covered and a barrier metal film is provided. However, in the present embodiment, the description will be omitted, and the barrier metal film illustrations will be omitted in FIGS. 1 to 6. This same principle shall be applied to each of the second to seventh embodiments later discussed and FIGS. 8 to 31 to be referred in each embodiment. Similarly, the source diffusion region 9a and drain diffusion region 9b of the MOSFET 2 are electrically connected to a bit line not illustrated but its detailed description and illustration are omitted.

Figure 2:
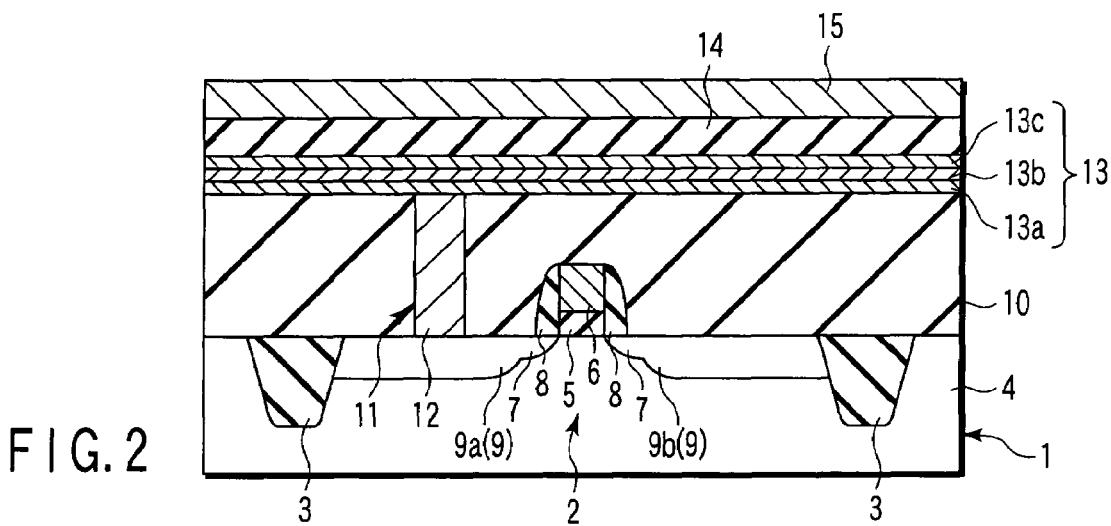
FIG. 2 is a cross-sectional process diagram that indicates the manufacturing method of the semiconductor device according to the first embodiment.

Next, as shown in FIG. 2, on the first-layer inter level dielectric film 10 with lower electrode contact plug 12 provided, materials which become the lower electrode 13 of the capacitive element (capacitor) 16, capacitive insulation film 14, and upper electrode 15 are successively stacked, respectively. Specifically, first of all, the material, which becomes the lower electrode 13 of the capacitor 16, is provided in such a manner as to cover relevant surfaces of the first-layer inter level dielectric film 10 and the lower electrode contact plug 12 is provided. In addition, as shown in FIG. 2, in the embodiment, the lower electrode 13 is formed in a three-layer construction comprising a lower layer film 13a, an intermediate layer film 13b, and an upper layer film 13c. More specifically, the lower layer film 13a of the lower electrode 13 is formed by, for example, a film of titanium/iridium (Ti/Ir). In addition, the intermediate film 13b is formed by, for example, an $IrO_2$ film which is an oxide of Ir. The upper layer film 13c of the lower electrode 13 is formed by a film of, for example, platinum (Pt). These Ti/Ir film 13a, $IrO_2$ film 13b, and Pt film 13c are formed by successively stacking by the sputtering process, respectively.

Continuously, to cover the surface of the lower electrode 13 (Pt film 13c), the material, which becomes a capacitive insulation film (capacitor insulation film) 14 of the capacitor 16, is provided. In the embodiment, the capacitor insulation film 14 is formed by the use of a ferroelectric film which is a kind of so-called high relative dielectric constant film (high-k film), whose relative dielectric constant is higher than that of ordinary insulation films such as $SiO_2$, etc. Specifically, the capacitor insulation film 14 is formed by the use of a $SrBi_2Ta_2O_9$ film (Sr—Bi—Ta—O film [=SBT film]. The SBT film 14 is formed by the sputtering process.

Then, to cover the surface of the SBT film 14, the material that becomes the upper electrode 15 of the capacitor 16 is provided. The upper electrode 15 is formed by using a film of SRO/platinum ($SrRuO_3$/Pt) or SRO/iridium oxide ($SrRuO_3$/IrOx). The $SrRuO_3$/Pt film ($SrRuO_3$/IrOx film) 15 is formed by the sputtering process.

Figure 3:
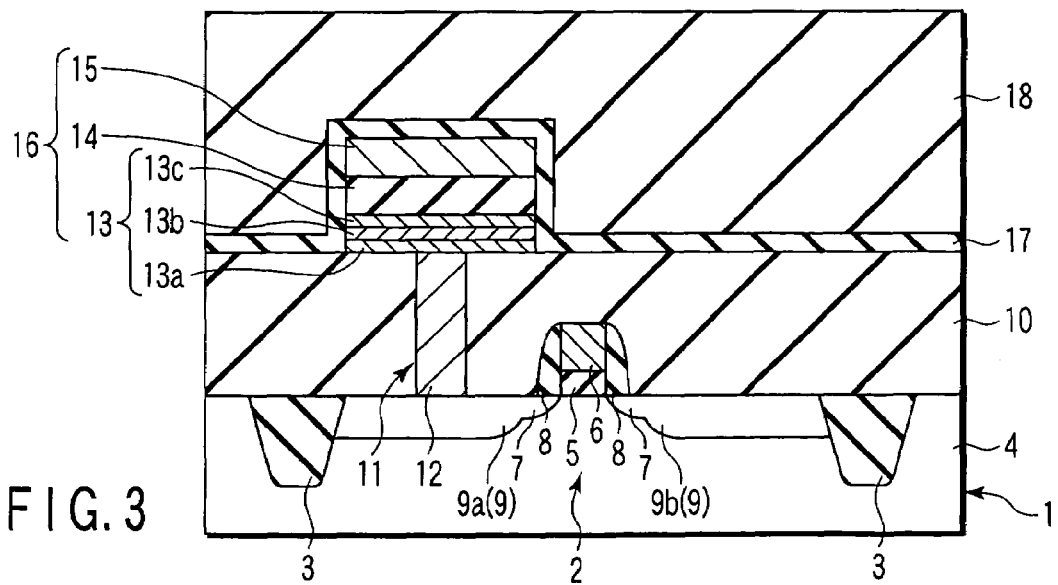
FIG. 3 is a cross-sectional process diagram that indicates the manufacturing method of the semiconductor device according to the first embodiment.

Next, as shown in FIG. 3, the Ti/Ir film 13a, $IrO_2$ film 13b, Pt film 13c, SBT film 14, and $SrRuO_3$/Pt film ($SrRuO_3$/IrOx film) 15 are formed in the predetermined shape of the capacitor 16 by lithography and etching. By the processes up to this point, the ferroelectric capacitor 16 formed into the desired construction is obtained as shown in FIG. 3. That is, the ferroelectric capacitor 16 which holds the SBT film 14, ferroelectric film, between the lower electrode 13 formed into a three-layer construction of the Ti/Ir film 13a, $IrO_2$ film 13b, and Pt film 13c and the upper electrode 15 formed by the $SrRuO_3$/Pt film ($SrRuO_3$/IrOx film) is provided above the Si substrate 1 by being electrically connected to the source diffused region 9a of the MOSFET 2 via the lower electrode contact plug 12.

Continuously, to cover the surfaces of the formed Ti/Ir film 13a, $IrO_2$ film 13b, Pt film 13c, SBT film 14, $SrRuO_3$/Pt film ($SrRuO_3$/IrOx film) 15, and the interlayer insulation film 10 of the first layer, a second adsorbent member 17 made of a material that adsorbs (captures) at least hydrogen (hydrogen atoms, molecular hydrogen, hydrogen ions) is provided. The second adsorbent member 17 functions as a so-called hydrogen barrier film that suppresses or reduces contacts of hydrogen with the ferroelectric capacitor 16 or invasion of hydrogen from outside to inside of the ferroelectric capacitor 16. In particular, in the back end of the line (BEOL) after the ferroelectric capacitor 16 is formed, the second adsorbent member 17 functions as a hydrogen barrier film that suppresses or reduces the susceptibility to the damage by hydrogen of the capacitor insulation film (SBT film) 14. In the embodiment, the second adsorbent member 17 is formed by the use of a film composed of aluminum oxides such as alumina ($Al_2O_3$), etc. The aluminum oxide film 17 is formed by, for example, sputtering process. In the subsequent description, the aluminum oxide film 17 is called the second hydrogen barrier film.

Continuously, to cover the surface of the second hydrogen barrier film 17, a second interlayer insulation film 18 is provided as the upper layer side interlayer insulation film. The second-layer interlayer insulation film 18 is formed by the CVD process as is the case of the first-layer interlayer insulation film 10. After forming the second-layer interlayer insulation film 18, the surface is flattened by the CMP process, etc. as required.

Figure 4:
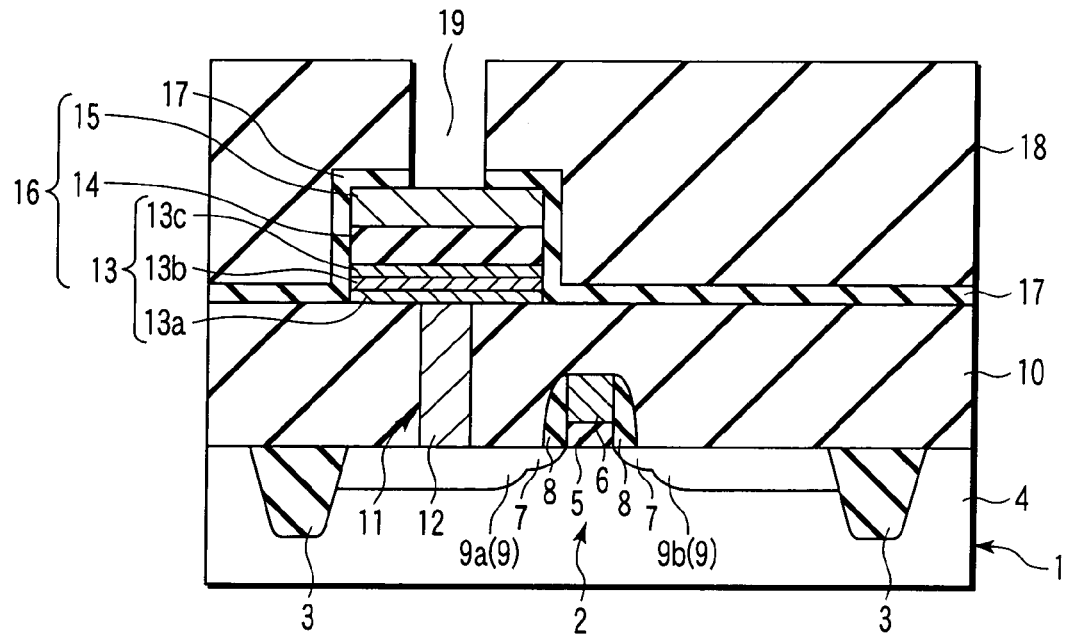
FIG. 4 is a cross-sectional process diagram that indicates the manufacturing method of the semiconductor device according to the first embodiment.

Next, as shown in FIG. 4, at least at one place above the upper electrode ($SrRuO_3$/Pt film or $SrRuO_3$/IrOx film) 15 of the ferroelectric capacitor 16, an upper electrode contact hole 19 is opened in such a manner to penetrate the second-layer interlayer insulation film 18 and the second hydrogen barrier film 17 along the thickness direction of these films. Thereby, the surface of the upper electrode 15 is exposed. The upper electrode contact hole 19 is formed by anisotropic etching such as dry etching, etc. as is the case of the lower electrode contact hole 11.

Figure 5:
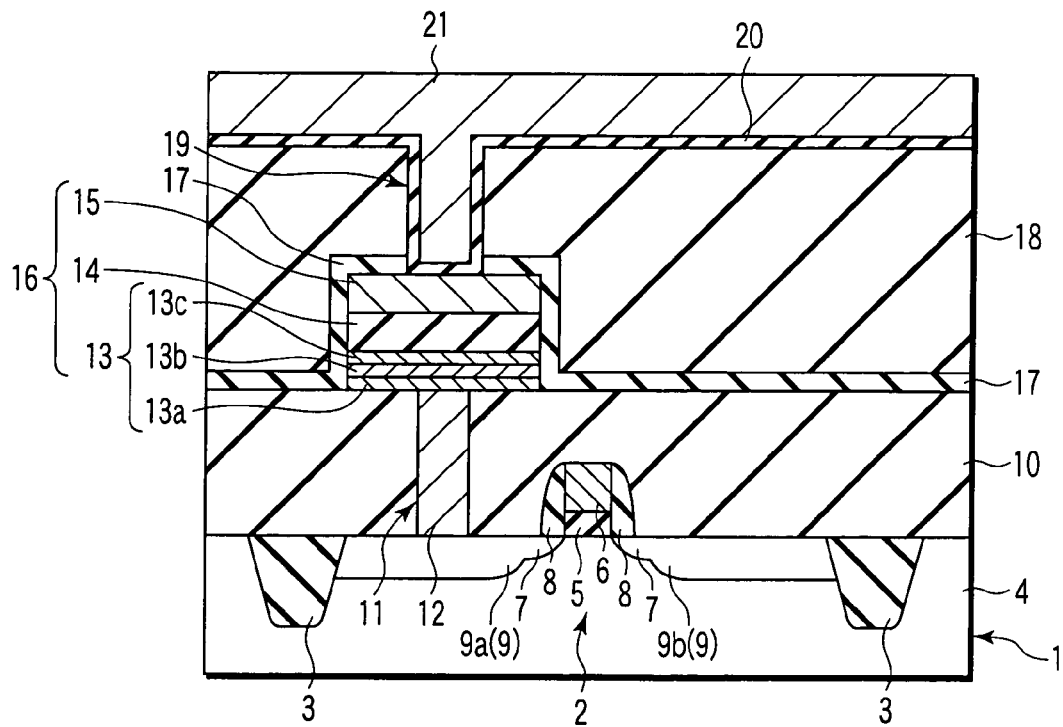
FIG. 5 is a cross-sectional process diagram that indicates the manufacturing method of the semiconductor device according to the first embodiment.

Next, as shown in FIG. 5, to cover the inner wall surface of the upper electrode contact hole 19, the surface of the upper electrode 15 ($SrRuO_3$/Pt film or $SrRuO_3$/IrOx film) exposed by the upper electrode contact hole 19, and the surface of the second-layer interlayer insulation film 18, the first adsorbent member 20 made of a material which adsorbs (captures) at least hydrogen (hydrogen atoms, molecular hydrogen, hydrogen ions) is provided. The portion of the first adsorbent member 20 formed on the side wall surface of the contact hole 19 serves as the side-wall adsorbent member. In addition, the first adsorbent member 20 functions as a so-called hydrogen barrier film that suppresses or reduces contacts of hydrogen with the ferroelectric capacitor 16 or invasion of hydrogen from outside to inside of the ferroelectric capacitor 16, as is the case of the second adsorbent member 17 described above. In particular, the first adsorbent member 20 functions as the hydrogen barrier film that suppresses or reduces the fear of the capacitor insulation film (SBT film) 14 to be damaged by hydrogen which intends to invade the inside of the ferroelectric capacitor 16 via the upper electrode contact hole 19 when an upper electrode contact plug 21 later discussed is provided in the upper electrode contact hole 19 in the back end of the line (BEOL) after the ferroelectric capacitor 16 has been formed. In the embodiment, this first adsorbent member 20 is formed by the use of a film composed of aluminum oxides such as alumina ($Al_2O_3$) as is the case of the second adsorbent member 17. The aluminum oxide film 20 is formed by, for example, sputtering process or Automatic Layer Deposition (ALD) process. In the subsequent description, the aluminum oxide film 20 is called the first hydrogen barrier film.

The first hydrogen barrier film 20 is provided with its part held between the upper electrode 15 of the ferroelectric capacitor 16 and the upper electrode contact plug 21 later discussed. However, almost all the material which has a property to adsorb hydrogen such as the first hydrogen barrier film 20 and the second hydrogen barrier film 17 discussed above is, in general, the insulator. Consequently, the first hydrogen barrier film 20 must be formed into a film thickness of such a level that can secure the electric conductivity (continuity) with the upper electrode 15 and the upper electrode contact plug 21 by some method. Such film thickness that can secure conductivity varies depending on the kind of materials, which provide hydrogen adsorption capabilities. In the embodiment, continuity between the upper electrode 15 and the upper electrode contact plug 21 via the first hydrogen barrier film 20 is set to be secured by the tunneling effect (tunnel current). Consequently, at least on the exposed surface of the upper electrode 15, the first hydrogen barrier film 20 is preferably accumulated to the film thickness, which enables the material aluminum oxide film 20 to function as a hydrogen barrier film and at the same time to exhibit the tunneling effect.

According to the experiments which the present inventors conducted, in the construction to provide the aluminum oxide film (first hydrogen barrier film) 20 held between the upper electrode 15 and the upper electrode contact plug 21, it has been found that the film thickness with which the aluminum oxide film 20 can exhibit hydrogen barrier effect and tunneling effect is about 5.0 nm at maximum when the aluminum oxide film 20 is formed by the ALD process. In the embodiment, the first hydrogen barrier film 20 has been accumulated on the surface of the second-layer interlayer insulation film 18 and the exposed surface of the upper electrode 15 by the ALD process until the uniform thin film shape comprising substantially homogeneous thickness of about 2.5 nm has been achieved. In addition, according to the experiments conducted by the present inventors, it also has been found that providing at least one oxygen recovery heat treatment to the ferroelectric capacitor 16 at least either before or after the accumulation process of the first hydrogen barrier film 20 by the ALD process can improve the electric properties of the ferroelectric capacitor 16. In the embodiment, illustrations are omitted but the hydrogen recovery heat treatment shall be carried out once on the ferroelectric capacitor 16 after the accumulation process of the first hydrogen barrier film 20.

Continuously, until at least the inside of the upper electrode contact hole 19 is filled, a conductor 21 such as aluminum (Al), copper (Cu), etc. is provided in such a manner as to cover the surface of the first hydrogen barrier film 20. The conductor 21 is provided by, for example, the CVD process.

Figure 6:
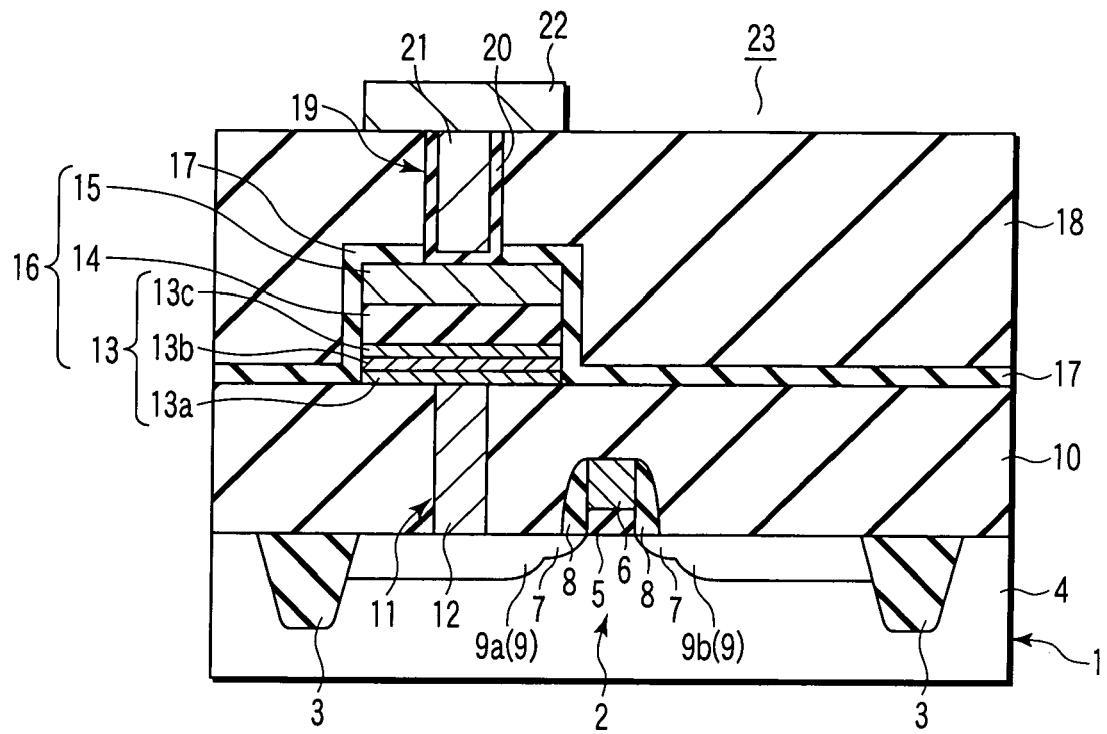
FIG. 6 is a cross-sectional process diagram that indicates the manufacturing method of the semiconductor device according to the first embodiment.

Next, as shown in FIG. 6, the unrequired first hydrogen barrier film 20 and conductor 21 on the surface of the second-layer interlayer insulation film 18 are ground and removed by the CMP process and the first hydrogen barrier film 20 and the conductor 21 are embedded in the inside of the upper electrode contact hole 19. Thereby, at least one of the upper electrode conductor 21 with its surface covered with the first hydrogen barrier film 20 is indirectly electrically connected to the upper electrode 15 of the ferroelectric capacitor 16 via the first hydrogen barrier film 20 and provided in the second layer interlayer insulation film 18. In the subsequent description, the upper electrode conductor 21 is called the upper electrode contact plug.

In the case where the upper electrode contact plug 21 is formed by Cu, in general, a barrier metal film is provided to cover the surface of the upper electrode contact plug 21. However, in the embodiment, the description will be omitted and, illustrations of the barrier metal film are omitted in FIGS. 5 and 6. This same principle applies to the description of each of the second to seventh embodiments later discussed and in FIGS. 10, 11, 15, 19, 23, 27, and 31 referred in each of these embodiments.

Continuously, on the second-layer interlayer insulation film 18 in which the first hydrogen barrier film 20 and the upper electrode contact plug 21 are embedded, the material that serves as the upper-layer wiring layer (upper-layer wiring) 22 is provided and is processed to be shaped into a predetermined form. Specifically, the conductor 22 of aluminum (Al), copper (Cu), etc. is formed on the surface of the second-layer interlayer insulation film 18 while it is being brought into contact with the surface (exposed surface) of the upper electrode contact plug 21 and shaped into a predetermined form. Thereby, an upper-layer wiring 22 which comes in direct contact with the upper end portion of the upper electrode contact plug 21 and is electrically connected to the upper electrode 15 of the ferroelectric capacitor 16 via the upper electrode contact plug 21 is obtained.

Thereafter, specific and detailed description and illustration are omitted but via the predetermined processes, a semiconductor device 23 according to the embodiment equipped with the desired capacitor construction shown in FIG. 6 is obtained. That is, the ferroelectric random access memory (FeRAM) 23 equipped with the ferroelectric capacitor 16 is obtained; the ferroelectric capacitor 16 has the capacitor insulation film 14 comprising the SBT film, ferromagnetic film, held between the upper electrode 13 comprising a three-layer stacking films of the Ti/Ir film 13a, $IrO_2$ film 13b, and Pt film 13c and the upper electrode 15 comprising $SrRuO_3$/Pt film or $SrRuO_3$/IrOx film, in which the upper electrode 15 and the upper electrode contact plug 21 are indirectly electrically connected via the first hydrogen barrier film 20 comprising the aluminum oxide film provided between them, and at the same time, the lower electrode 13 (Ti/Ir film 13a) is electrically connected to the source diffusion region 9a of the MOSFET 2 via the lower electrode contact plug 12, and the surface excluding the connections (contact portion) between the upper electrode 15 and the upper electrode contact plug 21 and the main surface (lower surface of the lower electrode 13) on the side connected to the lower electrode contact plug 12 of the lower electrode 13 (Ti/Ir film 13a) is covered with the second barrier film 17 comprising an aluminum oxide film.

Figure 7:
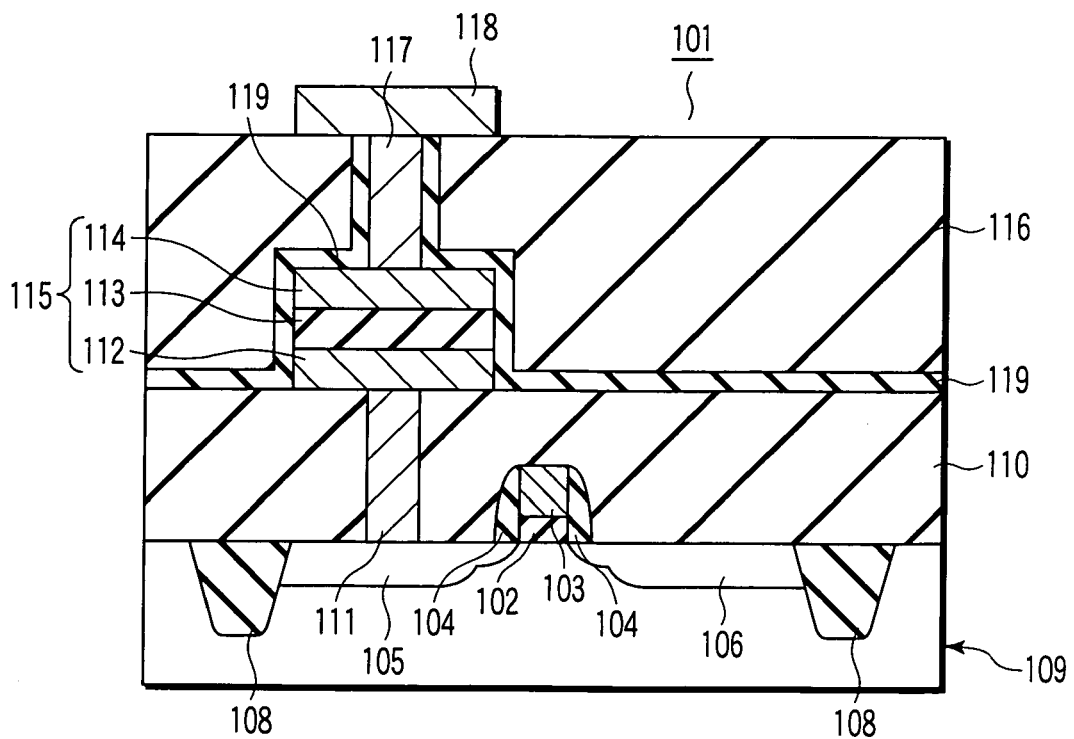
FIG. 7 is a cross-sectional view that indicates a semiconductor device related to a comparison for the semiconductor device according to the first embodiment.

Referring now to FIG. 7, a comparison for the present embodiment will be briefly described. FIG. 7 is a cross-sectional view that indicates a semiconductor device related to the comparison for the semiconductor device of the present embodiment.

As shown in FIG. 7, a FeRAM 101 related to this comparison has a construction substantially same as the construction of ferroelectric memory according to the above-mentioned Jpn. Pat. Appln. KOKAI Publication No. 7-273297. However, unlike the construction of the ferroelectric memory according to Jpn. Pat. Appln. KOKAI Publication No. 7-273297, in order to block hydrogen which intends to invade the ferroelectric capacitor 115 from the vicinity of connections (contact portion) between the upper electrode contact plug 117 and the upper electrode 114, the surface of the upper electrode contact plug 117 is covered with the hydrogen barrier film 119 except the connections with the upper electrode 114. In the FeRAM 101 formed by this kind of construction, hydrogen is difficult to invade the inside of the ferroelectric capacitor 115 as compared to the ferroelectric memory according to Jpn. Pat. Appln. KOKAI Publication No. 7-273297, the capacitor insulation film 113 is less susceptible to damage by hydrogen.

However, the FeRAM 101 is not provided with the hydrogen barrier film between the upper electrode 114 and the upper electrode contact plug 117 as is the case of the ferroelectric memory according to Jpn. Pat. Appln. KOKAI Publication No. 7-273297. Consequently, in the FeRAM 101 as well, same as the ferroelectric memory according to Jpn. Pat. Appln. KOKAI Publication No. 7-273297, the capacitor insulation film 113 is more susceptible to damage by hydrogen in the back end of the line and the film quality and ferromagnetic characteristics of the capacitor insulation film 113 as well as the electric properties of the ferroelectric capacitor 115 are easier to be markedly degraded as compared to the FeRAM 23 of the present embodiment. As a result, the FeRAM 101 has the performance, reliability, quality etc. markedly degraded as compared to those of the FeRAM 23 according to the embodiment. That is, in the FeRAM 101 with the construction shown in FIG. 7, it has not reached the level that the capacitor insulation film 113 can perfectly prevent damage caused by hydrogen in the back end of the line.

With regard to the FeRAM 101 and ferroelectric memory according to Jpn. Pat. Appln. KOKAI Publication No. 7-273297, the surface of the ferroelectric capacitor 16 is covered by the second hydrogen barrier film 17 except the connections between the upper electrode 15 and the upper electrode contact plug 21 as well as the lower surface of the lower electrode 13 in the FeRAM 23 according to the embodiment as described above. In addition, the surface of the upper electrode contact plug 21 is covered with the first hydrogen barrier film 20, and the first hydrogen barrier film 20 is provided between the upper electrode 15 and the upper electrode contact plug 21. That is, the surface of the ferroelectric capacitor 16 is substantially fully covered with the first hydrogen barrier film 20 and the second hydrogen barrier film 17. According to such kind of construction, it is possible, in the FeRAM 23, to almost completely block hydrogen by adsorbing (capturing) the hydrogen with the first hydrogen barrier film 20, which intends to invade the inside of the upper electrode contact plug 21 in the upper electrode contact hole 11 in the back end of the line after the ferroelectric capacitor 16 is formed during the manufacturing process. Thereby, the FeRAM 23 can suppress or reduce fears of damage to the capacitor insulation film 14 by hydrogen in the back end of the line.

Consequently, the FeRAM 23 according to the embodiment is difficult to have film quality and ferroelectric characteristics of the capacitor insulation film 14 degraded and is practically free of degradation of the electric properties of the ferroelectric capacitor 16 as compared to the FeRAM 101 of the comparison or the ferroelectric memory according to Jpn. Pat. Appln. KOKAI Publication No. 7-273297. As a result, as compared to the FeRAM 101 of the comparison or the ferroelectric memory according to Jpn. Pat. Appln. KOKAI Publication No. 7-273297, the performance of FeRAM 23 shows reliability, quality, etc. are difficult to be degraded. According to the prototype experiments carried out by the present inventors, it has been found that the FeRAM 23 equipped with the ferroelectric capacitor 16 with the above-mentioned construction has various defect occurrence ratio arising from degradation of the capacitor insulation film 14 and manufacturing yields (product yields), etc. improved as compared to the FeRAM 101 and the ferroelectric memory according to Jpn. Pat. Appln. KOKAI Publication No. 7-273297. That is, it has been found that the FeRAM 23 has the performance, reliability, quality, production efficiency, etc. improved as compared to the FeRAM 101 and the ferroelectric memory according to Jpn. Pat. Appln. KOKAI Publication No. 7-273297.

As described above, according to this first embodiment, the FeRAM 23 is equipped with the ferroelectric capacitor 16 with degradation of ferromagnetic capacitor insulation film 14 by hydrogen suppressed, and therefore its performance, reliability, quality, production efficiency, etc. have been improved. At the same time, according to this first embodiment, the FeRAM 23 as described above can be manufactured efficiently and easily without adopting any special process.

Second Embodiment

Referring now to FIGS. 8 to 11, a second embodiment according to the invention will be described as follows. FIGS. 8 to 11 are cross-sectional process diagrams that each indicate a manufacturing method of a semiconductor device according to the embodiment. Incidentally, like portions of the first embodiment are designated by like reference characters and their detailed description will be omitted. In addition, unless otherwise specified, the processes same as the first embodiment will be adopted for the present embodiment as well.

In this embodiment, unlike the first embodiment, the first hydrogen barrier film provided to the connections between the upper electrode and the upper electrode contact plug is provided by forming not into uniform thin-film shape with substantially homogeneous film thickness but into non-uniform thin film shape with holes partially provided. Now, detailed description will be made as follows.

Figure 8:
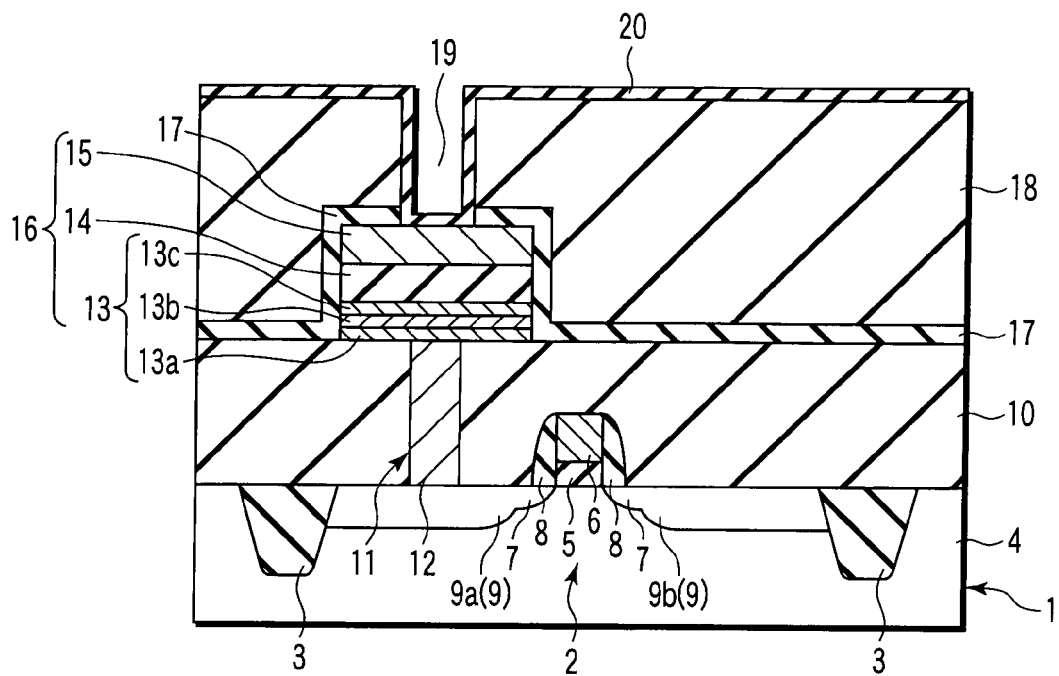
FIG. 8 is a cross-sectional process diagram that indicates a manufacturing method of a semiconductor device according to a second embodiment.

First of all, as shown in FIG. 8, the MOSFET 2, first-layer interlayer insulation film 10, lower electrode contact plug 12, ferroelectric capacitor 16, second hydrogen barrier film 17 and second-layer interlayer insulation film 18 are provided on the Si substrate 1. Continuously, in the second-layer interlayer insulation film 18, the upper electrode contact hole 19 is formed, and the first hydrogen barrier film 20 is provided in such a manner as to cover the inner wall surface of this upper electrode contact hole 19, the surface of the upper electrode 15 ($SrRuO_3$/Pt film or $SrRuO_3$/IrOx film) of the ferroelectric capacitor 16 exposed from the upper electrode contact hole 19, and the surface of the second-layer interlayer insulation film 18. In this case, the first hydrogen barrier film 20 formed on the side-wall surface of the contact hole 19 becomes the side-wall adsorbent member as is the case of the first embodiment. In the embodiment, the aluminum oxide film 20 as the first hydrogen barrier film is accumulated on the surface of the second interlayer insulation film 18, etc. by the ALD process until the film thickness achieves about 5 nm.

Figure 9:
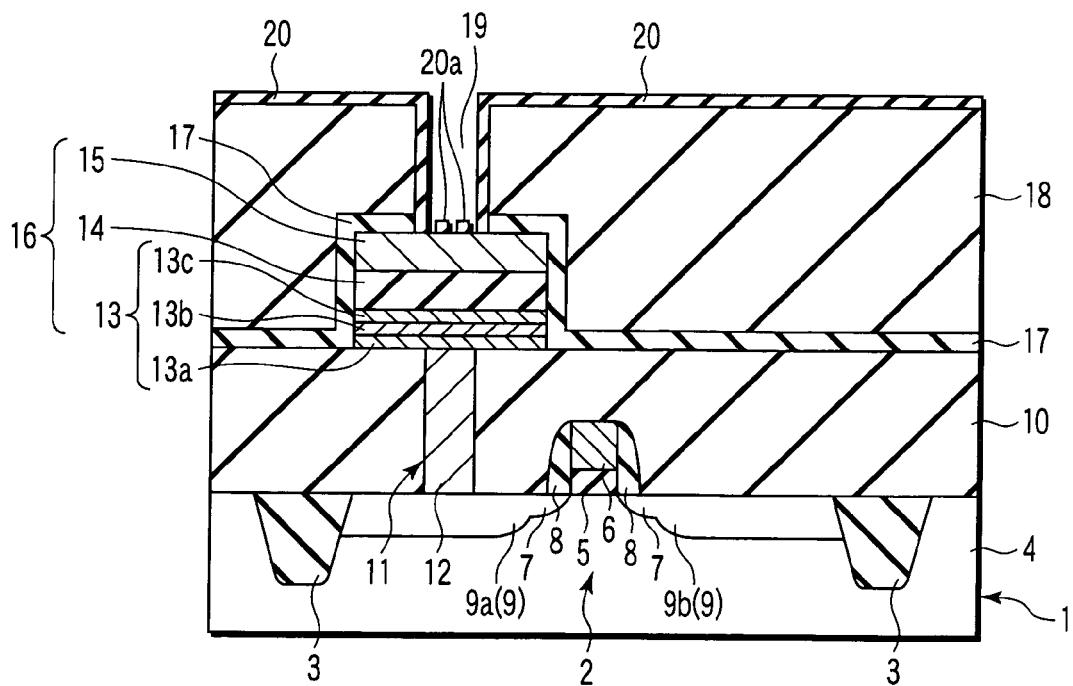
FIG. 9 is a cross-sectional process diagram that indicates the manufacturing method of the semiconductor device according to the second embodiment.

Next, as shown in FIG. 9, the first hydrogen barrier film 20 in the upper electrode contact hole 19 is removed by partially etching by the anisotropic etching process. Specifically, dry etching such as reactive ion etching (RIE), etc. is carried out under the setting of etchbacking the first hydrogen barrier film 20 by about 2.5 nm in terms of film thickness to the first hydrogen barrier film 20 on the bottom surface (surface of the upper electrode 15) of the upper electrode contact hole 19, of the first hydrogen barrier film 20 formed inside the upper electrode contact hole 19 in the film thickness of about 5 nm.

Thereby, on the inner wall surface of the upper electrode contact hole 19 in the upper electrode contact hole 19, the first hydrogen barrier film 20 about 5 nm in film thickness is left substantially as it is in the form of homogeneous thin film which has uniform film thickness. In addition, on the surface of the upper electrode 15 of the upper electrode contact hole 19, the first hydrogen barrier film 20 is removed until the surface of the upper electrode 15 is partially exposed and the first hydrogen barrier film (remaining film) that remains on the surface of the upper electrode 15 is etchbacked until the film thickness of the first hydrogen barrier film 20a becomes about 5 nm to about 2.5 nm. That is, on the surface of the upper electrode 15, the film thickness of the first hydrogen barrier film 20a is set to the thickness substantially one half the film thickness of the fist hydrogen barrier film 20a on the inner wall surface of the upper electrode contact hole 19. Simultaneously, the first hydrogen barrier film 20a is allowed to remain on the surface of the upper electrode 15 by forming it not into uniform thin film shape with substantially homogenous film thickness but into non-uniform thin film shape with holes partially provided. In this case, the amount of the first hydrogen barrier film 20a which is left on the surface of the upper electrode 15 or the coverage of the upper electrode 15 by the first hydrogen barrier film 20a shall be set to the level which can capture hydrogen which passes each hole provided in the first hydrogen barrier film 20a and intends to invade the inside of the ferroelectric capacitor 16 (upper electrode 15) by the gettering effects of the first hydrogen barrier film 20a and can suppress or reduce invasion of hydrogen in the ferroelectric capacitor 16 inside.

In this way, in the present embodiment, unlike the first embodiment, the first hydrogen barrier films (residual films) 20, 20a which are left inside the upper electrode contact hole 19 are formed in a dense thin film shape that covers this on the inner wall surface of the upper electrode contact hole, and on the bottom surface of the upper electrode contact hole 19, this is formed in a sparse thin film shape which partially covers this. Continuously, the illustration is omitted but after the first hydrogen barrier films 20, 20a are formed in the shape described above, oxygen recovery heat treatment is carried out once for the ferroelectric capacitor 16.

Figure 10:
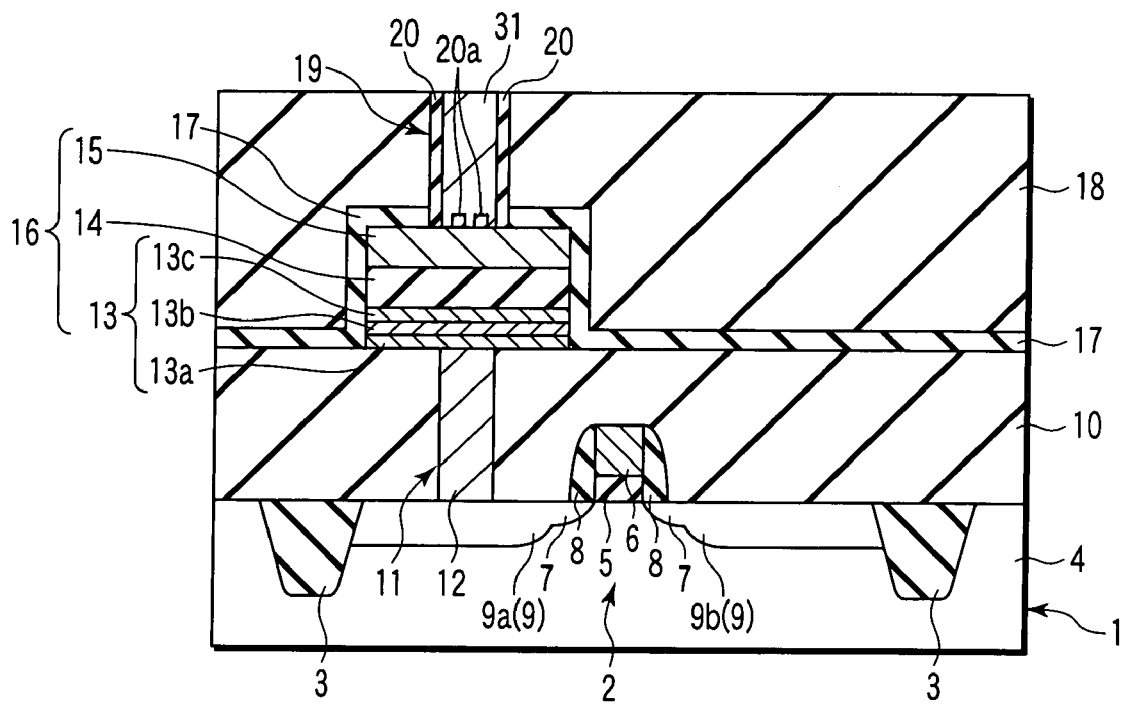
FIG. 10 is a cross-sectional process diagram that indicates the manufacturing method of the semiconductor device according to the second embodiment.

Then, as shown in FIG. 10, the first hydrogen barrier films 20, 20a and the upper electrode conductor 31 are embedded in the upper electrode contact hole 19. Thereby, the upper electrode contact plug 31 with the side surface covered with the first hydrogen barrier film 20 is provided to the second-layer interlayer insulation film 18. As descried above, multiple pieces of holes are provided to the first hydrogen barrier film 20a left on the bottom surface (surface of the upper electrode 15) of the upper electrode contact hole 19. Consequently, unlike the upper electrode contact plug 21 of the first embodiment, the upper electrode contact plug 31 of the present embodiment has the lower end portions (bottom portion, bottom surface) brought partially in direct contact with the surface of the upper electrode 15 of the ferroelectric capacitor 16.

Figure 11:
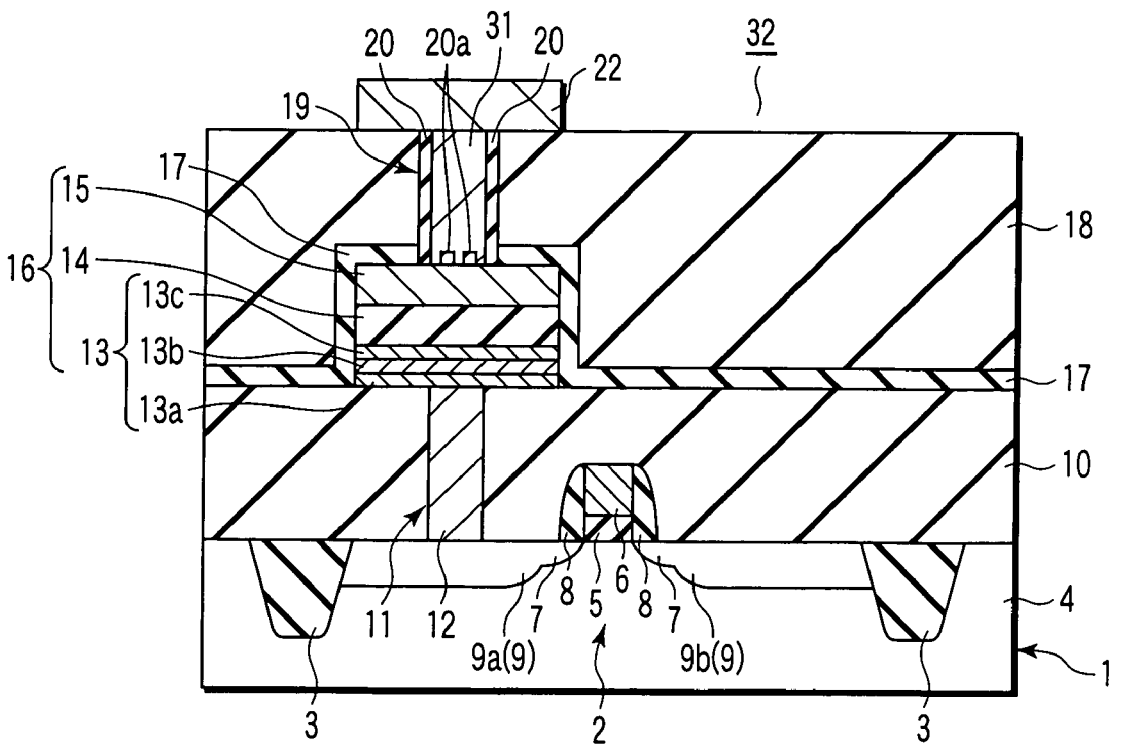
FIG. 11 is a cross-sectional process diagram that indicates the manufacturing method of the semiconductor device according to the second embodiment.

Next, as shown in FIG. 11, the upper layer wiring 22 is provided on the surface of the second-layer interlayer insulation film 18 while it is brought in direct contact with the upper end portion of the upper electrode contact plug 31. Thereafter, specific and detailed description and illustrations will be omitted, but by going through planned and predetermined processes, the semiconductor device 32 according to the embodiment provided with the desired capacitor construction shown in FIG. 11 is obtained. That is, the FeRAM 32 is obtained, which has the construction in which the first hydrogen barrier film 20a provided between the upper electrode 15 of the ferroelectric capacitor 16 and the upper electrode contact plug 31 is formed in a sparse thin film shape with multiple holes provided, and the upper electrode 15 and the upper electrode contact plug 31 are partially electrically connected.

As descried above, according to the second embodiment, the effects similar to those of the first embodiment described above can be obtained. In the present embodiment, unlike the first embodiment, the first hydrogen barrier film 20a provided to the connections (contact portion, interface) between the upper electrode 15 and the upper electrode contact plug 31 is formed in a sparse thin-film shape with multiple pieces of holes provided, and the upper electrode 15 and the upper electrode contact plug 31 are partially in direct contact with each other. Consequently, in the present embodiment, unlike the first embodiment, continuity between the upper electrode 15 and the upper electrode contact plug 31 can be secured not only by the current that directly flows the first hydrogen barrier film 20a but also by the current that directly flows between the upper electrode 15 and the upper electrode contact plug 31. Consequently, the electric conductivity between the upper electrode 15 and the upper electrode contact plug 31 in the embodiment is improved from the electric conductivity between the upper electrode 15 and the upper electrode contact plug 21 in the first embodiment.

Furthermore, the first hydrogen barrier film 20a provided at the connections between the upper electrode 15 and the upper electrode contact plug 31 are formed in the sparse thin-film shape with multiple pieces of holes provided. For this reason, the oxygen feed rate to the ferroelectric capacitor 16 in the oxygen recovery heat treatment after the first hydrogen barrier films 20, 20a are provided is increased from the first embodiment. Consequently, the ferroelectric capacitor 16 of the present embodiment has the electric characteristics improved as compared to the ferroelectric capacitor 16 of the first embodiment.

Third Embodiment

Referring now to FIGS. 12 to 15, a third embodiment according to the invention will be described as follows. FIGS. 12 to 15 are cross-sectional process diagrams that each indicate a manufacturing method of a semiconductor device according to the embodiment. Incidentally, portions similar to those previously described with reference to the first and second embodiments are denoted by the same reference numerals, and their detailed descriptions will be omitted. In addition, unless otherwise predetermined, processes similar to the first embodiment will be adopted in the present embodiment.

In the present embodiment, unlike the first embodiment, the first hydrogen barrier film is provided inside the upper electrode, not in the connections between the upper electrode and the upper electrode contact plug. Now, the third embodiment will be described in detail as follows.

Figure 12:
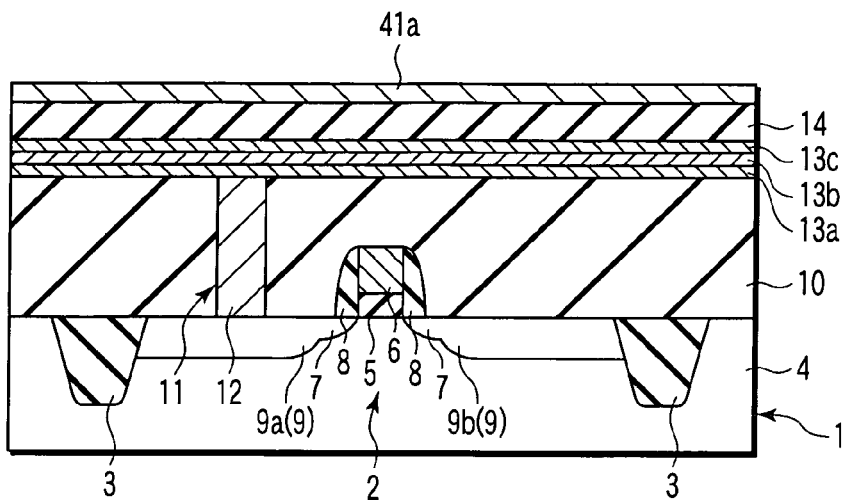
FIG. 12 is a cross-sectional process diagram that indicates a manufacturing method of a semiconductor device according to a third embodiment.

First of all, as shown in FIG. 12, the MOSFET 2, first-layer interlayer insulation film 10, lower electrode contact plug 12, lower electrode 13 (Ti/Ir film 13a, $IrO_2$ film 13b, Pt film 13c), and capacitor insulation film (SBT film) 14 are provided on the Si substrate 1. Continuously, the surface of the capacitor insulation film 14 is covered to provide the material that serves as an upper electrode 41. In the present embodiment, unlike each of the first and second embodiments, the upper electrode 41 is formed by a conductor and an insulator. Specifically, the portion of the upper electrode 41 comprising the conductor is formed in a double-layer structure of a lower layer side 41a and an upper layer side 41c. The upper electrode 41 is formed with a first hydrogen barrier film 41b as a middle-layer insulation portion held between the lower-layer side conductor portion 41a and the upper-layer side conductor portion 41c. Consequently, first of all, the surface of the capacitor insulation film 14 is covered, and the upper electrode 41a on the lower-layer side, which is the lower-layer side conductor portion of the upper electrode 41, is provided.

Figure 13:
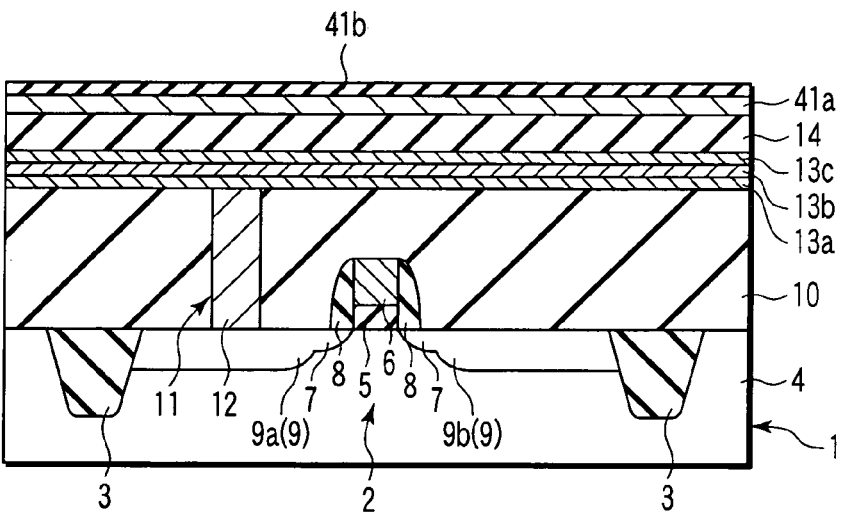
FIG. 13 is a cross-sectional process diagram that indicates the manufacturing method of the semiconductor device according to the third embodiment.

Next, as shown in FIG. 13, the first hydrogen barrier film 41b composed of an aluminum oxide film is provided in such a manner as to cover the surface of the lower-layer side upper electrode 41a. In this case, the film thickness of the first hydrogen barrier film 41b is set to the size that enables the tunnel current to flow between the lower-layer side upper electrode 41a which holds this from upper and lower and the upper-layer side upper electrode 41c later discussed, and to the size that can capture hydrogen which intends to invade inside the capacitor insulation film 14 from the upper-layer side upper electrode 41c. In the embodiment, the first hydrogen barrier film 41b is accumulated on the surface of the lower-layer side upper electrode 41a until the film thickness becomes about 1 nm.

Figure 14:
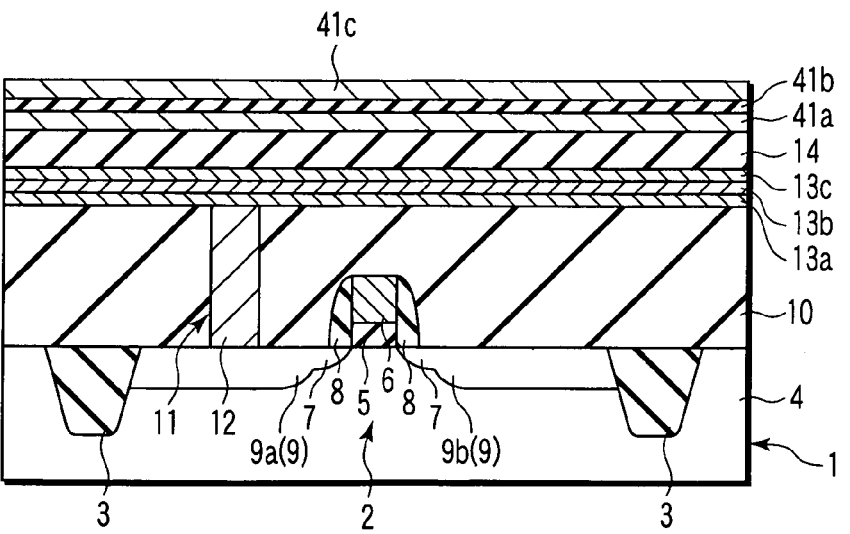
FIG. 14 is a cross-sectional process diagram that indicates the manufacturing method of the semiconductor device according to the third embodiment.

Next, as shown in FIG. 14, to cover the surface of the first hydrogen barrier film 41b, the upper-layer side upper electrode 41c, which is the upper-layer side conductor portion of the upper electrode 41, is provided. These upper-layer side upper electrode 41c and the lower-layer side upper electrode 41a may be formed by the same material or may be formed by materials different from each other. In the embodiment, same as the upper electrode 15 of the first embodiment, the upper-layer side upper electrode 41c is formed by the use of the SRO/platinum (SrRuO$_3$/Pt) film or SRO/iridium oxide (SrRuO$_3$/IrOx) film. On the contrary, the lower-layer side upper electrode 41a is formed by the use of the Pt film.

Figure 15:
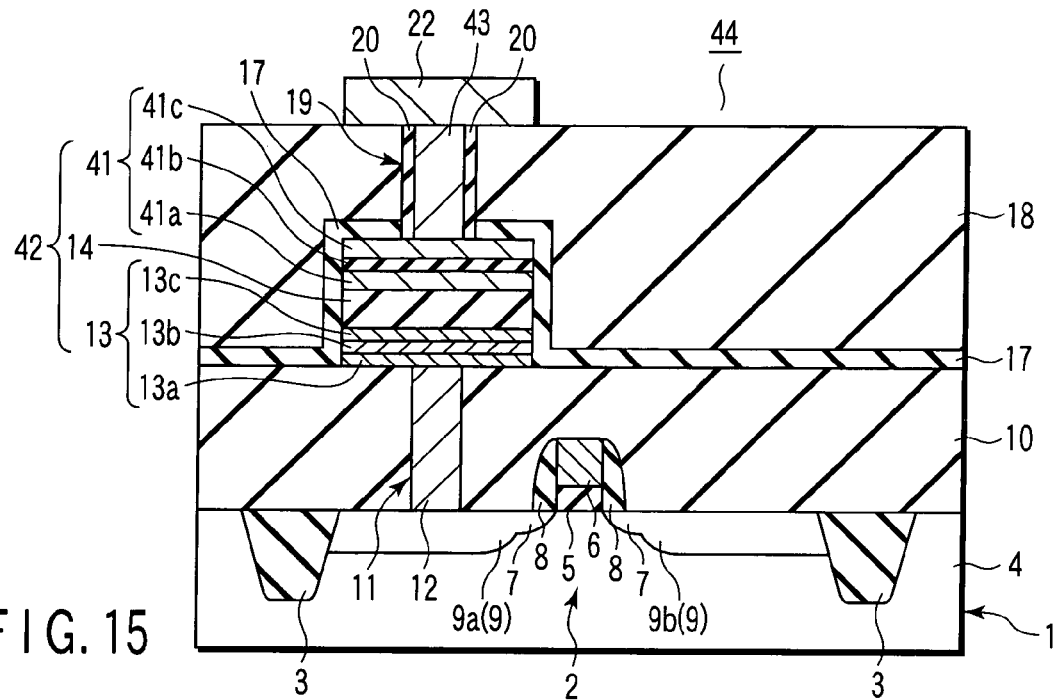
FIG. 15 is a cross-sectional process diagram that indicates the manufacturing method of the semiconductor device according to the third embodiment.

Next, as shown in FIG. 15, the lower electrode (Ti/Ir film 13a, IrO$_2$ film 13b, Pt film 13c), capacitor insulation film (SBT film) 14, and the upper electrode 41 (lower-layer side upper electrode 41a, first hydrogen barrier film 41b, upper-layer side upper electrode 41c) are processed to be formed in the planned and predetermined shape of a ferroelectric capacitor 42 by lithography and etching. By the processes up to this point, the ferroelectric capacitor 42 formed into the desired construction is obtained as shown in FIG. 15. That is, the ferroelectric capacitor 42 formed with the capacitor insulation film (SBT film) 14 held between the lower electrode 13 (Ti/Ir film 13a, IrO$_2$ film 13b, Pt film 13c) and the upper electrode 41 formed in the three-layer construction of the lower-layer side upper electrode (Pt film) 41a, first hydrogen barrier film (aluminum oxide film) 41b, and upper-layer side upper electrode (SrRuO$_3$/Pt film or SrRuO$_3$/IrOx film) 41c is provided above the Si substrate 1 by electrically connected to the source diffused region 9a of the MOSFET 2 via the lower electrode contact plug 12.

Continuously, to cover the surfaces of the ferroelectric capacitor 42 and the first-layer interlayer insulation film 10, the second hydrogen barrier film 17 composed of the aluminum oxide film and the second-layer interlayer insulation film 18 are provided. Thereafter, the surface of the second-layer interlayer insulation film 18 is flattened as required. Continuously, the upper electrode contact hole 19 is provided by penetrating the surface of the second-layer interlayer insulation film 18 and the second hydrogen barrier film 17 along the thickness direction of these films. Thereby, the surface of the upper electrode (upper-layer side upper electrode 41c) 41 is exposed. Continuously, the first hydrogen barrier film 20 composed of the aluminum oxide film is provided until the film thickness reaches about 2.5 nm to cover the inner wall surface of the upper electrode contact hole 19, the surface of the upper electrode 41 (upper-layer side upper electrode 41c) exposed by the upper electrode contact hole 19, and the surface of the second-layer interlayer insulation film 18. In this occasion as well, the first hydrogen barrier film 20 formed on the side wall surface of the contact hole 19 serves as the side-wall adsorbent member same as each of the first and second embodiments. Thereafter, oxygen recovery treatment is carried out once for the ferroelectric capacitor 42.

Continuously, of the first hydrogen barrier film 20 provided inside the upper electrode contact hole 19, the first hydrogen barrier film 20 provided on the surface of the upper electrode 41 is removed by anisotropic etching such as dry etching, etc., and the surface of the upper electrode 41 (upper-layer side upper electrode 41c) is exposed again. Continuously, the first hydrogen barrier film 20 and a conductor 43 are embedded in the inside of the upper electrode contact hole 19. Thereby, an upper electrode contact plug 43 with the side surface covered with the hydrogen barrier film 20 is provided inside the second-layer interlayer insulation film 18. The upper electrode contact plug 43 of the present embodiment differs from the upper electrode contact pug 21 of the first embodiment or the upper electrode contact plug 31 of the second embodiment and has the lower end portion (bottom portion) entirely brought in direct contact with the upper electrode 15 of the ferroelectric capacitor 16. Continuously, the upper-layer wiring 22 is brought in direct contact with the upper end portion of the upper electrode contact plug 43 and is provided on the surface of the second-layer interlayer insulation film 18.

Thereafter, the specific and detailed description and illustrations will be omitted, but by undergoing the planned and predetermined processes, a semiconductor device 44 according to the embodiment equipped with the desired capacitor construction shown in FIG. 15 is obtained. That is, the FeRAM 44 is obtained, which is formed with the capacitor insulation film 14 composed of the SBT film held between the lower electrode 13 comprising three-layer stacking films of the Ti/Ir film 13a, IrO$_2$ film 13b, and Pt film 13c and the upper electrode 41 comprising three-layer stacking films of the lower-layer side upper electrode (Pt film) 41a, first hydrogen barrier film (aluminum oxide film) 41b, and upper-layer side upper electrode (SrRuO$_3$/Pt film or SrRuO$_3$/IrOx film) 41c, and is equipped with the ferroelectric capacitor 42 formed in a construction in which the upper electrode 41 and the upper electrode contact plug 43 are connected in such a manner as to be entirely brought in direct contact with each other.

As described above, according to the third embodiment, effects similar to those obtained by each of the first and second embodiments previously described can be obtained. In addition, in the present embodiment, unlike each of the first and second embodiments, the first hydrogen barrier film 20 is located at the intermediate portion of the upper electrode, and at the connections (contact portion) between the upper electrode 41 and the upper electrode contact plug 43, no first hydrogen barrier film 20 exists at all. Consequently, the upper electrode 41 and the upper electrode contact plug 43 are entirely brought in direct contact. Thereby, in the present embodiment, unlike each of the first and second embodiments, all the continuity with the upper electrode 41 and the upper electrode contact plug 43 can be secured by the current which directly flows between them. Consequently, the electric conductivity between the upper electrode 41 and the upper electrode contact plug 43 in the present embodiment is improved from the electric conductivity between the upper electrode 15 and the upper electrode contact plugs 21, 31 in each of the first and second embodiments.

In addition, since no first hydrogen barrier film 20 exists at all at the connections between the upper electrode 41 and the upper electrode contact plug 43, the federate of oxygen to the ferroelectric capacitor 42 in the oxygen recovery heat treatment after the first hydrogen barrier film 20 is provided is increased as compared to that of each of the first and second embodiments. Consequently, the ferroelectric capacitor 42 of the present embodiment has the electric characteristics further more improved as compared to the ferroelectric capacitor 16 of each of the first and second embodiments.

Fourth Embodiment

Referring now to FIGS. 16 to 19, a fourth embodiment according to the invention will be described. FIGS. 16 to 19 are cross-sectional process diagrams that each indicate a manufacturing method of a semiconductor devices according to the embodiment. Like reference characters denote like portions of each of the first to third embodiments and their detailed descriptions will be omitted. In addition, unless otherwise predetermined, the processes same as the first embodiment will be adopted for the present embodiment as well.

In the present embodiment, unlike the first embodiment, the first hydrogen barrier film is provided not at the connections between the upper electrode and the upper electrode contact plug but at the connections between the lower electrode and the lower electrode contact plug. Thereby, hydrogen which intends to intrude the ferroelectric capacitor inside from the first-layer interlayer insulation film (lower-layer side interlayer insulation film) or the connections between the lower electrode and the lower electrode contact plug is blocked and degradation of electric characteristics of the ferroelectric capacitor are suppressed. Now, it is described in detail as follows.

Figure 16:
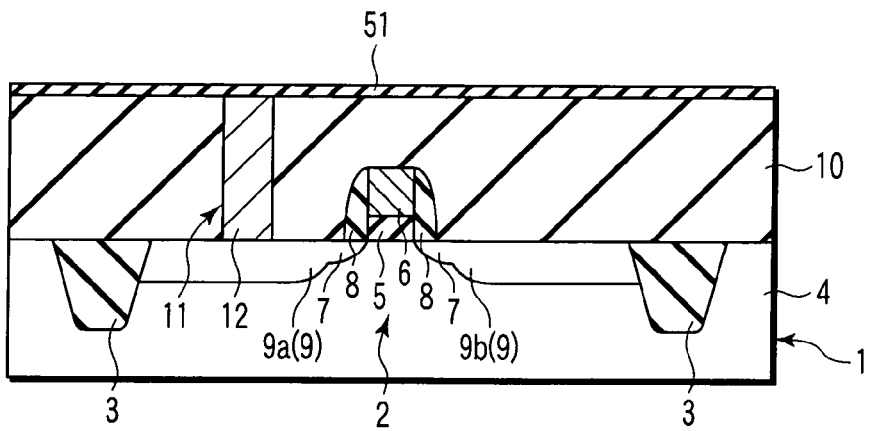
FIG. 16 is a cross-sectional process diagram that indicates a manufacturing method of a semiconductor device according to a fourth embodiment.

First of all, as shown in FIG. 16, the MOSFET 2, the first-layer interlayer insulation film 10, and the lower electrode contact plug 12 are provided on the Si substrate 1. Continuously, to cover the surface of the first-layer interlayer insulation film 10, a first hydrogen barrier film 51 composed of an aluminum oxide film is provided. In the present embodiment, the first hydrogen barrier film 51 is accumulated on the surface of the first-layer interlayer insulation film 10 until the film thickness reaches about 2.5 nm.

Figure 17:
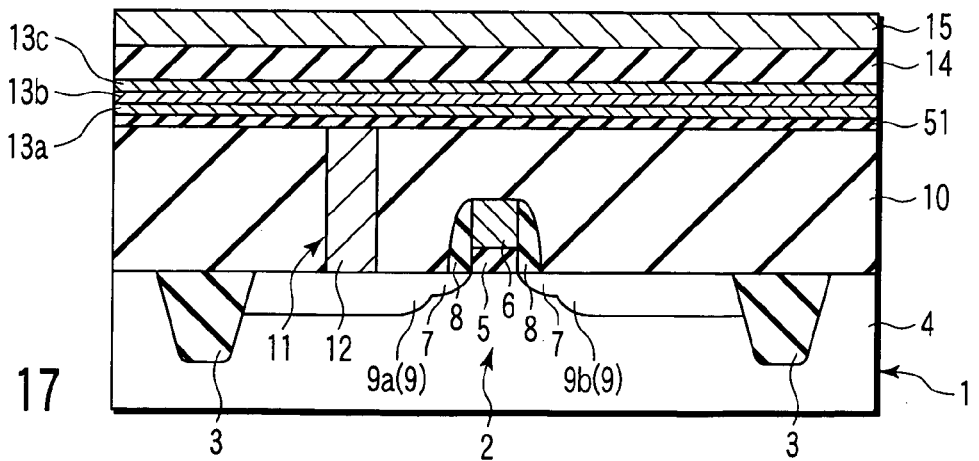
FIG. 17 is a cross-sectional process diagram that indicates the manufacturing method of the semiconductor device according to the fourth embodiment.

Next, as shown in FIG. 17, to cover the surface of the first hydrogen barrier film 51, Ti/Ir film 13a, $IrO_2$ film 13b, and Pt film 13c which form the lower electrode 13, the SBT film 14 which serves as the capacitor insulation film, and the $SrRuO_3$/Pt film ($SrRuO_3$/IrOx film) 15 which serves as the upper electrode are successively stacked and provided. Consequently, in the present embodiment, the first hydrogen barrier film 51 is provided between the lower electrode (Ti/Ir film 13a) and the lower electrode contact plug 12.

Figure 18:
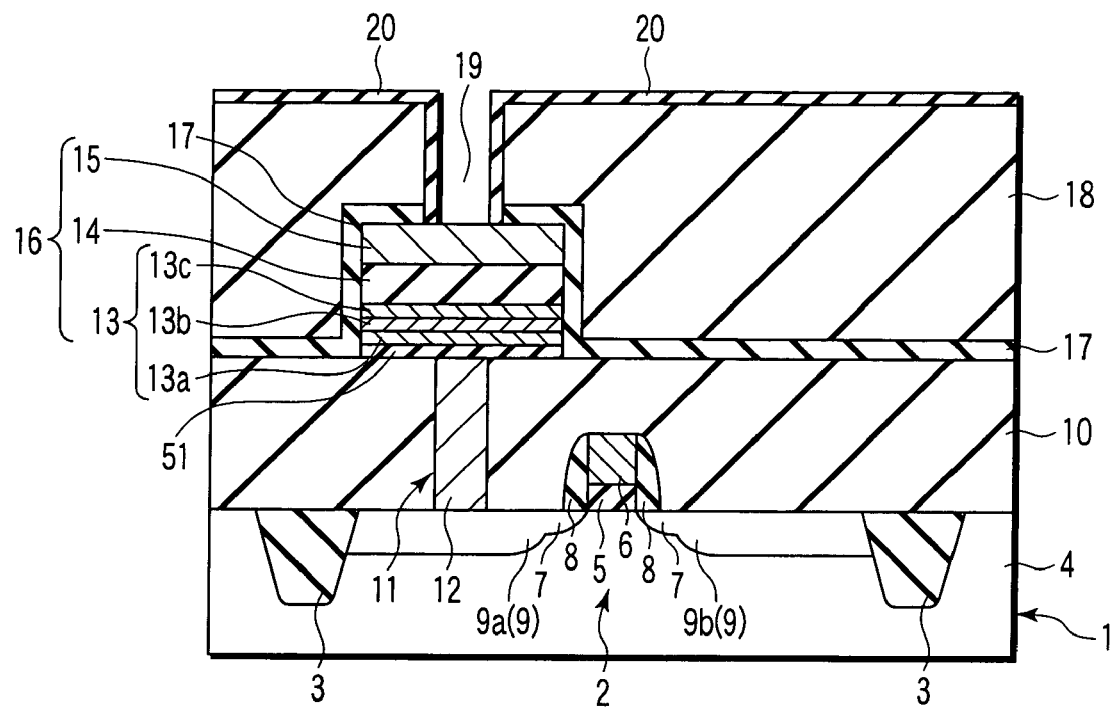
FIG. 18 is a cross-sectional process diagram that indicates the manufacturing method of the semiconductor device according to the fourth embodiment.

Next, as shown in FIG. 18, the first hydrogen barrier film 51, the lower electrode 13 (Ti/Ir film 13a, $IrO_2$ film 13b, Pt film 13c), capacitor insulation film (SBT film) 14, and upper electrode 15 ($SrRuO_3$/Pt film or $SrRuO_3$/IrOx film) are processed to be formed in the planned and predetermined shape of the ferroelectric capacitor 16 by lithography and etching. By the processes up to this point, the ferroelectric capacitor 16 formed into the desired construction is obtained as shown in FIG. 18. That is, the ferroelectric capacitor 16 formed with the capacitor insulation film (SBT film) 14 held between the lower electrode 13 (Ti/Ir film 13a, $IrO_2$ film 13b, Pt film 13c) and the upper electrode 15 ($SrRuO_3$/Pt film or $SrRuO_3$/IrOx film) is provided above the Si substrate 1 with the lower surface of the lower electrode 13 (Ti/Ir film 13a) covered by the first hydrogen barrier film (aluminum oxide film) 51 and electrically connected to the source diffused region 9a via the first hydrogen barrier film 51 and the lower electrode contact plug 12.

Continuously, to cover the surfaces of the first hydrogen barrier film 51, the ferroelectric capacitor 16, and the first-layer interlayer insulation film 10, the second hydrogen barrier film 17 composed of the aluminum oxide film and the second-layer interlayer insulation film 18 are provided. Thereafter, the surface of the second-layer interlayer insulation film 18 is flattened as required. Continuously, the upper electrode contact hole 19 is provided by penetrating the surface of the second-layer interlayer insulation film 18 and the second hydrogen barrier film 17 along the thickness direction of these films. Thereby, the surface of the upper electrode 15 is exposed. Continuously, the first hydrogen barrier film 20 composed of the aluminum oxide film is provided until the film thickness reaches about 2.5 nm to cover the inner wall surface of the upper electrode contact hole 19, the surface of the upper electrode 15 exposed by the upper electrode contact hole 19, and the surface of the second-layer interlayer insulation film 18. In this occasion as well, the first hydrogen barrier film 20 formed on the side wall surface of the contact hole 19 serves as the side-wall adsorbent member same as each of the first to third embodiments. Thereafter, oxygen recovery treatment is carried out once for the ferroelectric capacitor 42. Continuously, of the first hydrogen barrier film 20 provided inside the upper electrode contact hole 19, the first hydrogen barrier film 20 provided on the surface of the upper electrode 15 is removed by anisotropic etching such as dry etching, etc., and the surface of the upper electrode 15 is exposed again.

Figure 19:
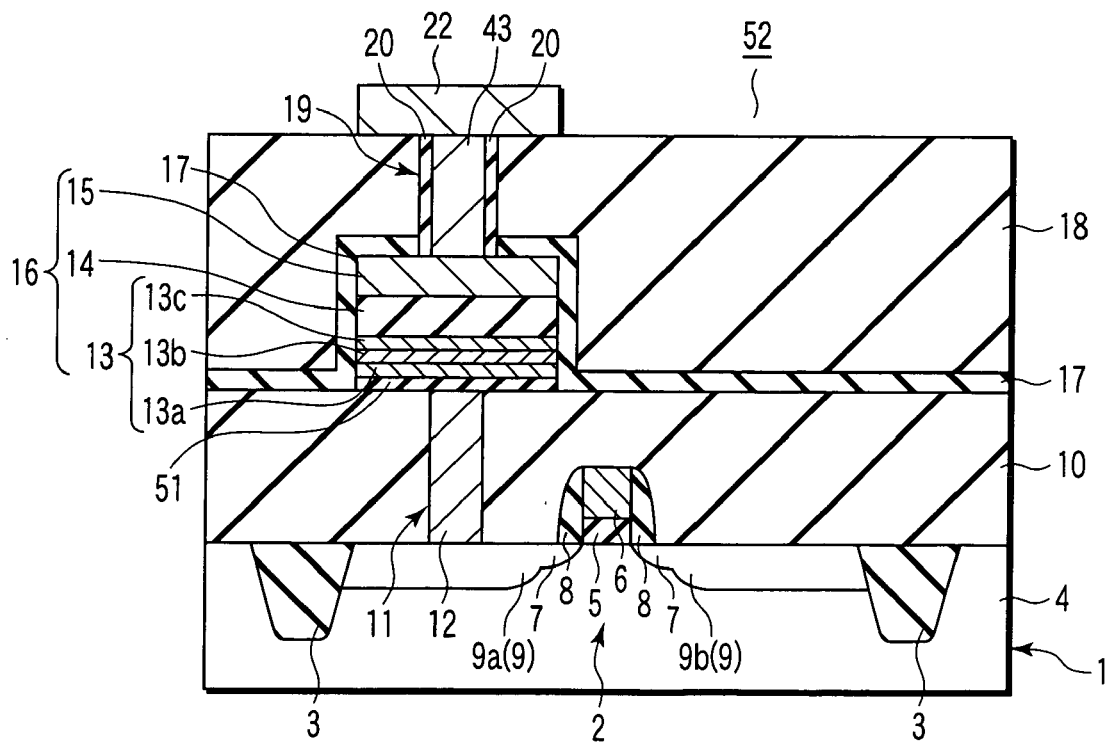
FIG. 19 is a cross-sectional process diagram that indicates the manufacturing method of the semiconductor device according to the fourth embodiment.

Next, as shown in FIG. 19, the first hydrogen barrier film 20 and the upper electrode conductor 43 are embedded in the inside of the upper electrode contact hole 19. Thereby, the upper electrode contact plug 43 with the side surface covered with the hydrogen barrier film 20 is provided inside the second-layer interlayer insulation film 18. The upper electrode contact plug 43 of the present embodiment has the lower end portion (bottom portion) entirely brought in direct contact with the upper electrode 15 of the ferroelectric capacitor 16 as is the case of the upper electrode contact plug 43 of the third embodiment. Continuously, the upper-layer wiring 22 is brought in direct contact with the upper end portion of the upper electrode contact plug 43 and is provided on the surface of the second-layer interlayer insulation film 18.

Thereafter, the specific and detailed description and illustrations will be omitted, but by undergoing the planned and predetermined processes, a semiconductor device 52 according to the embodiment equipped with the desired capacitor construction shown in FIG. 19 is obtained. That is, the FeRAM 52 is obtained, which is formed with the capacitor insulation film 14 comprising the SBT film held between the lower electrode 13 comprising three-layer stacking films of Ti/Ir film 13a, $IrO_2$ film 13b, and Pt film 13c and the upper electrode 15 comprising $SrRuO_3$/Pt film or $SrRuO_3$/IrOx film, and is equipped with the ferroelectric capacitor 16 formed in a construction in which the lower surface of the lower electrode 13 (Ti/Ir film 13a) covered by the first hydrogen barrier film (aluminum oxide film) 51 and the lower electrode 13 and the lower electrode contact plug 12 are indirectly electrically connected via this first hydrogen barrier film 51, and the upper electrode 15 and the upper electrode contact plug 43 are connected in such a manner as to be entirely brought in direct contact with each other.

As described above, according to the fourth embodiment, effects similar to those obtained by each of the first to third embodiments previously described can be obtained. In addition, in the present embodiment, unlike each of the first and second embodiments in which the first hydrogen barrier film 20 is provided at the connections between the upper electrode 15 and the upper electrode contact plug 43 or the third embodiment in which the first hydrogen barrier film 41b is provided inside the upper electrode 41, the first hydrogen barrier film 51 is located at the connections (contact portion) between the lower electrode 13 (Ti/Ir film 13a) and the lower electrode contact plug 12. That is, in the ferroelectric capacitors 16, 42 which the first to third FeRAMs 23, 32, 44 are equipped with, the first hydrogen barrier films 20, 41b are provided above the capacitor insulation film 14, but in the ferroelectric capacitor 16 which the FeRAM 52 of the present embodiment is equipped with, the first hydrogen barrier film 51 is provided on the lower side of the capacitor insulation film 14. According to this kind of construction, hydrogen which intends to intrude the inside of the ferroelectric capacitor 16 from the first-layer interlayer insulation film 10 or lower electrode contact hole 11 can be adsorbed, caught, intercepted, or blocked by the first hydrogen barrier film 51, and degradation of electric characteristics of the ferroelectric capacitor 16 can be suppressed or reduced.

In addition, the aluminum oxide film that forms the first hydrogen barrier film 51 can intercept or block not only hydrogen but also oxygen (oxygen atom, molecular oxygen, and oxygen ion) as well. That is, the first hydrogen barrier film 51 provides not only hydrogen intercepting effects (hydrogen blocking effects) but also oxygen intercepting effects (oxygen blocking effects). By providing this kind of first hydrogen barrier film 51 between the lower electrode 13 and the lower electrode contact plug 12, it is possible to suppress or reduce oxygen that moves (diffuses) towards the upper electrode 15, ferroelectric capacitor insulation film 14, or the lower electrode contact plug 12 via the lower electrode 13, etc. when aerobic high-temperature treatment or the above-mentioned oxygen recovery heat treatment in the fabrication process of the ferroelectric capacitor 16. Thereby, in the manufacturing process of the FeRAM 52, it is possible to suppress or reduce oxidation of the lower electrode contact plug 12. Consequently, the FeRAM 52 of the present embodiment provides the improved plug yield of the lower electrode contact plug 12. As a result, the FeRAM 52 can provide improved manufacturing yield of the whole products.

The present inventors conducted experiments to provide oxygen recovery heat treatment at temperatures higher than usual, respectively, to the ferroelectric capacitor 16 which the FeRAM 52 of the present embodiment is equipped and a ferroelectric capacitor 115 which a FeRAM 101 related to the comparison for the FeRAM 23 of the first embodiment described above is equipped. As a result, it has been found out that the FeRAM 52 in which the first hydrogen barrier film 51 is provided between the lower electrode 13 and the lower electrode contact plug 12 has the contact yield between the lower electrode contact plug 12 and the lower electrode 13 improved as compared to the ferroelectric capacitor 115 in which no hydrogen barrier film is provided between a lower electrode contact plug 111 and a lower electrode 112. In addition, it has been found out that the first hydrogen barrier film exhibits the above-mentioned effects by providing the first hydrogen barrier film at least to either the upper electrode side or the lower electrode side.

Fifth Embodiment

Referring now to FIGS. 20 to 23, a fifth embodiment according to the invention will be described as follows. FIGS. 20 to 23 are cross-sectional process diagrams that each indicate a manufacturing method of a semiconductor device according to the embodiment. Incidentally, portions similar to those previously described with reference to the first to fourth embodiments are denoted by the same reference numerals, and their detailed descriptions will be omitted. In addition, unless otherwise predetermined, processes similar to the first embodiment will be adopted in the present embodiment.

In the present embodiment, the relevant constructions of the lower electrode and the upper electrode of the ferroelectric capacitor are constructions in which the upper electrode 13 and the lower electrode 41 of the ferroelectric capacitor 42, which the FeRAM 44 of the third embodiment is equipped, are inverted. That is, inside the lower electrode (intermediate portion), the first hydrogen barrier film is provided, and the upper electrode is formed as a single-layer film comprising a single conductor. Thereby, same as the fourth embodiment, hydrogen, which intends to intrude the ferroelectric capacitor inside from the first-layer interlayer insulation film (lower-layer side interlayer insulation film) or connections between the lower electrode and the lower electrode contact plug is intercepted (blocked) and degradation of electric characteristics of the ferroelectric capacitor is suppressed. Now, the fifth embodiment will be described in detail as follows.

Figure 20:
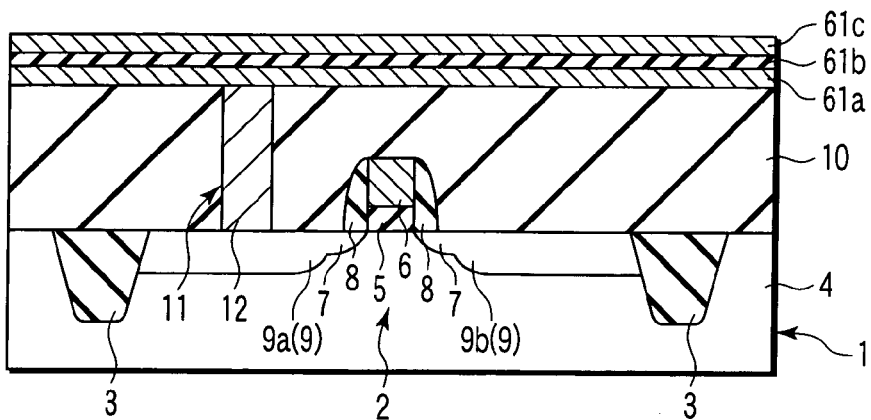
FIG. 20 is a cross-sectional process diagram that indicates a manufacturing method of a semiconductor device according to the fifth embodiment.

First of all, as shown in FIG. 20, the MOSFET 2, first-layer interlayer insulation film 10, and lower electrode contact plug 12 are provided on the Si substrate 1. Continuously, the surface of the first-layer interlayer insulation film 10 is covered to provide the material that serves as an upper electrode 61. In the present embodiment, unlike each of the first to fourth embodiments, the lower electrode 61 is formed by a conductor and an insulator. Specifically, the portion of the lower electrode 61 comprising the conductor is formed in a double-layer structure of a lower-layer side 61a and an upper-layer side 61c. The lower electrode 61 is formed with a first hydrogen barrier film 61b as a middle-layer insulation portion held between the lower-layer side conductor portion 61a and the upper-layer side conductor portion 61c. Consequently, first of all, the surface of the first-layer interlayer insulation film 10 is covered and the lower electrode 61a on the lower-layer side, which is the lower-layer side conductor portion of the lower electrode 61, is provided.

Next, the first hydrogen barrier film 61b composed of the aluminum oxide film is provided in such a manner as to cover the surface of the lower-layer side lower electrode 61a. In this case, the film thickness of the first hydrogen barrier film 61b is set to the size that enables the tunnel current to flow between the upper-layer side lower electrode 61a which holds this from upper and lower and the upper-layer side lower electrode 61c, and to the size that can capture hydrogen which intends to invade inside the capacitor insulation film 14 from the lower-layer side lower electrode 61a. In the present embodiment, the first hydrogen barrier film 61b is accumulated on the surface of the lower-layer side lower electrode 61a until the film thickness becomes about 1 nm.

Next, to cover the surface of the first hydrogen barrier film 61b, the upper-layer side lower electrode 61c, which is the upper-layer side conductor portion of the lower electrode 61, is provided. The upper-layer side lower electrode 61c and the lower-layer side lower electrode 61a may be formed by the same material or may be formed by materials different from each other as is the case of the third embodiment. In the present embodiment, unlike the third embodiment, the upper-layer side lower electrode 61c is formed by the use of the Pt film, while the lower-layer side lower electrode 61a is formed by the use of the titanium/iridium (Ti/Ir) film.

Figure 21:
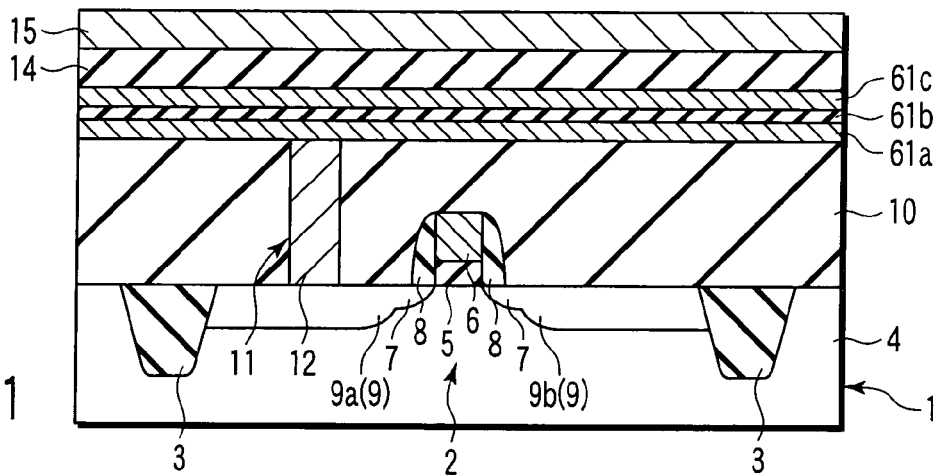
FIG. 21 is a cross-sectional process diagram that indicates the manufacturing method of the semiconductor device according to the fifth embodiment.

Next, as shown in FIG. 21, the SBT film 14 that becomes the capacitor insulation film and the Pt film 15 that becomes the upper electrode are successively stacked, respectively, in such a manner to cover the surface of the upper-layer side lower electrode (Pt film) 61c.

Figure 22:
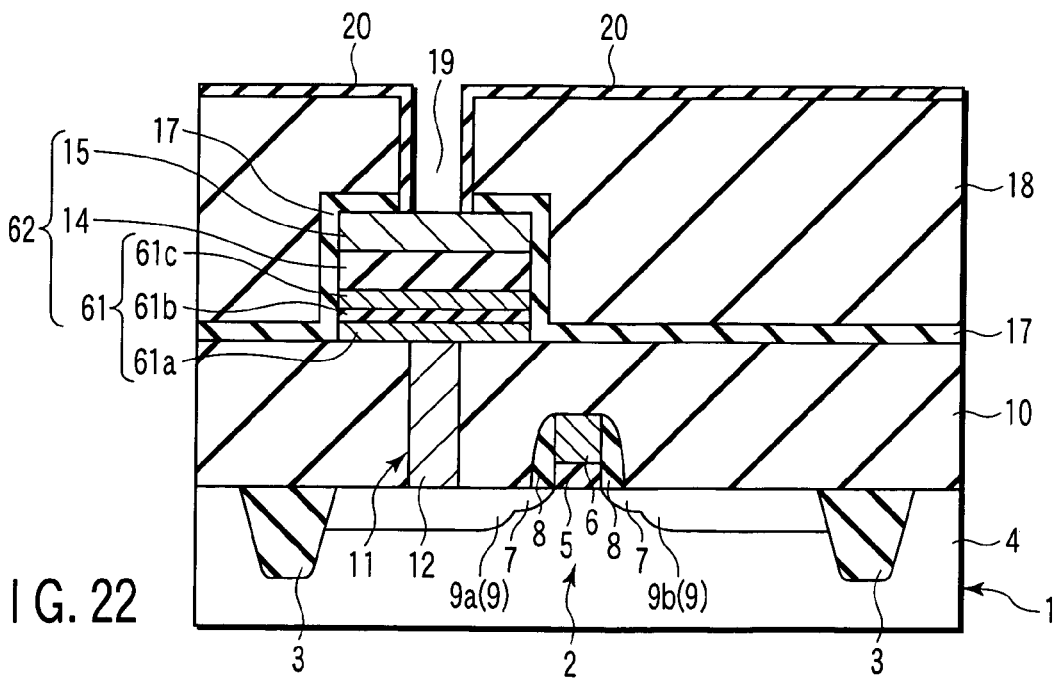
FIG. 22 is a cross-sectional process diagram that indicates the manufacturing method of the semiconductor device according to the fifth embodiment.

Next, as shown in FIG. 22, the lower electrode 61 (lower-layer side lower electrode 61a, first hydrogen barrier film 61b, and upper-layer side lower electrode 61c), capacitor insulation film (SBT film) 14, and upper electrode 15 ($SrRuO_3$/Pt film or $SrRuO_3$/IrOx film) are processed to be formed in the planned and predetermined shape of a ferroelectric capacitor 62 by lithography and etching. By the processes up to this point, the ferroelectric capacitor 62 formed into the desired construction is obtained as shown in FIG. 22. That is, the ferroelectric capacitor 62 formed in such a manner that the relevant constructions of the lower electrode 61 and the upper electrode 15 is formed by turning the other way the lower electrode 13 and the upper electrode 41 of the ferroelectric capacitor 42 with which the FeRAM 44 of the third embodiment is equipped. Specifically, the ferroelectric capacitor 62 formed with the capacitor insulation film (SBT film) 14 held between the lower electrode 61a (Ti/Ir film), the first hydrogen barrier film (aluminum oxide film) 61b, and the upper-layer side lower electrode 61c (Pt film) formed in the three-layer construction and upper-layer side upper electrode ($SrRuO_3$/Pt film or $SrRuO_3$/IrOx film) 15 is provided above the Si substrate 1 by electrically connected to the source diffused region 9a of the MOSFET 2 via the lower electrode contact plug 12.

Continuously, to cover the surfaces of the ferroelectric capacitor 62 and the first-layer interlayer insulation film 10, the second hydrogen barrier film 17 composed of the aluminum oxide film and the second-layer interlayer insulation film 18 are provided. Thereafter, the surface of the second-layer interlayer insulation film 18 is flattened as required. Continuously, the upper electrode contact hole 19 is provided by penetrating the surface of the second-layer interlayer insulation film 18 and the second hydrogen barrier film 17 along the thickness direction of these films. Thereby, the surface of the upper electrode 15 is exposed. Continuously, the first hydrogen barrier film 20 composed of the aluminum oxide film is provided until the film thickness reaches about 2.5 nm to cover the inner wall surface of the upper electrode contact hole 19, the surface of the upper electrode 15 exposed by the upper electrode contact hole 19, and the surface of the second-layer interlayer insulation film 18. In this occasion as well, the first hydrogen barrier film 20 formed on the side wall surface of the contact hole 19 serves as the side-wall adsorbent member same as each of the first to fourth embodiments. Thereafter, oxygen recovery treatment is carried out once for the ferroelectric capacitor 62. Continuously, of the first hydrogen barrier film 20 provided inside the upper electrode contact hole 19, the first hydrogen barrier film 20 provided on the surface of the upper electrode 15 is removed by anisotropic etching such as dry etching, etc., and the surface of the upper electrode 15 is exposed again.

Figure 23:
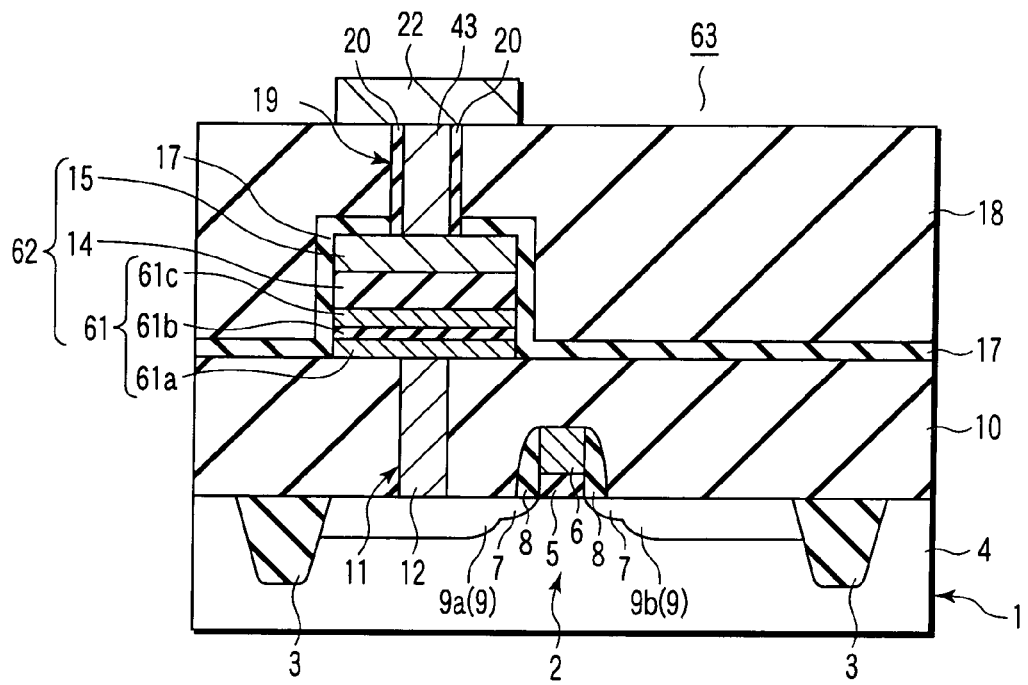
FIG. 23 is a cross-sectional process diagram that indicates the manufacturing method of the semiconductor device according to the fifth embodiment.

Next, as shown in FIG. 23, the first hydrogen barrier film 20 and the conductor 43 are embedded in the inside of the upper electrode contact hole 19. Thereby, the upper electrode contact plug 43 with the side surface covered with the hydrogen barrier film 20 is provided inside the second-layer interlayer insulation film 18. The upper electrode contact plug 43 of the present embodiment, same as the upper electrode contact pug 43 of each of the third and the fourth embodiments, has the lower end portion (bottom portion) entirely brought in direct contact with the upper electrode 15 of the ferroelectric capacitor 16. Continuously, the upper-layer wiring 22 is brought in direct contact with the upper end portion of the upper electrode contact plug 43 and is provided on the surface of the second-layer interlayer insulation film 18.

Thereafter, the specific and detailed description and illustrations will be omitted, but by undergoing the planned and predetermined processes, the semiconductor device 52 according to the embodiment equipped with the desired capacitor construction shown in FIG. 23 is obtained. That is, the FeRAM 44 is obtained, which is formed with the capacitor insulation film 14 comprising the SBT film held between the lower electrode 61 comprising three-layer stacking films of lower-layer side lower electrode (Ti/Ir film) 61a, the first hydrogen barrier film (aluminum oxide film) 61b, and the upper-layer side lower electrode (Pt film) 61c and the upper electrode 15 comprising SrRuO$_3$/Pt film or SrRuO$_3$/IrOx film, and is equipped with the ferroelectric capacitor 62 formed in a construction in which the lower electrode 61 (lower-layer side lower electrode 61a) is connected to the lower electrode contact plug 12 while they are brought entirely in contact with each other and the upper electrode 15 comes completely in direct contact with the upper electrode contact plug 43.

As described above, according to the fifth embodiment, effects similar to those obtained by each of the first to fourth embodiments previously described can be obtained. In addition, same as the fourth embodiment, the present inventors conducted experiments to provide oxygen recovery heat treatment at temperatures higher than usual, respectively, to the ferroelectric capacitor 62 which a FeRAM 63 of the present embodiment is equipped and the ferroelectric capacitor 115 which the FeRAM 101 related to the comparison for the FeRAM 23 of the first embodiment described above is equipped. As a result, same as the fourth embodiment, it has been found out that FeRAM 63 in which the first hydrogen barrier film 51 is provided at the intermediate portion of the lower electrode 61 has the contact yield between the lower electrode contact plug 12 and the lower electrode 61 improved as compared to the ferroelectric capacitor 115 in which no hydrogen barrier film is provided between the lower electrode contact plug 111 and the lower electrode 112. In addition, it has been found out that the first hydrogen barrier film exhibits the above-mentioned effects by providing the first hydrogen barrier film at least to either the upper electrode side or the lower electrode side.

Sixth Embodiment

Referring now to FIGS. 24 to 27, a sixth embodiment according to the invention will be described. FIGS. 24 to 27 are cross-sectional process diagrams that each indicate a manufacturing method of a semiconductor device according to the embodiment. Like reference characters denote like portions of each of the first to fifth embodiments and their detailed descriptions will be omitted. In addition, unless otherwise predetermined, the processes same as the first embodiment will be adopted for the present embodiment as well.

In the present embodiment, unlike each of the first to fifth embodiment, the number of the lower electrode contact plugs connected to the lower electrode and the number of the upper electrode contact plugs connected to the upper electrode are set to be not single, respectively, but to be a plurality of pieces, respectively. Thereby, the plug yield (contact yield) in the relevant connections (contact portions) between the lower electrode and the lower electrode contact plug and between the upper electrode and the upper electrode contact plug, respectively, will be improved. Now, the sixth embodiment is described in detail as follows.

Figure 24:
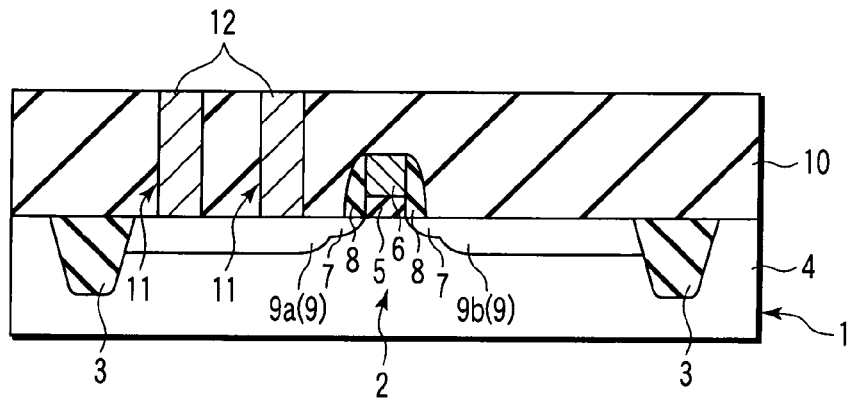
FIG. 24 is a cross-sectional process diagram that indicates a manufacturing method of a semiconductor device according to a sixth embodiment.

First of all, as shown in FIG. 24, the MOSFET 2, the first-layer interlayer insulation film 10, and the lower electrode contact plug 12 are provided on the Si substrate 1. However, in the present embodiment, unlike each of the first to fifth embodiments, two pieces of the lower electrode contact plug 12 shall be provided in place of one.

Figure 25:
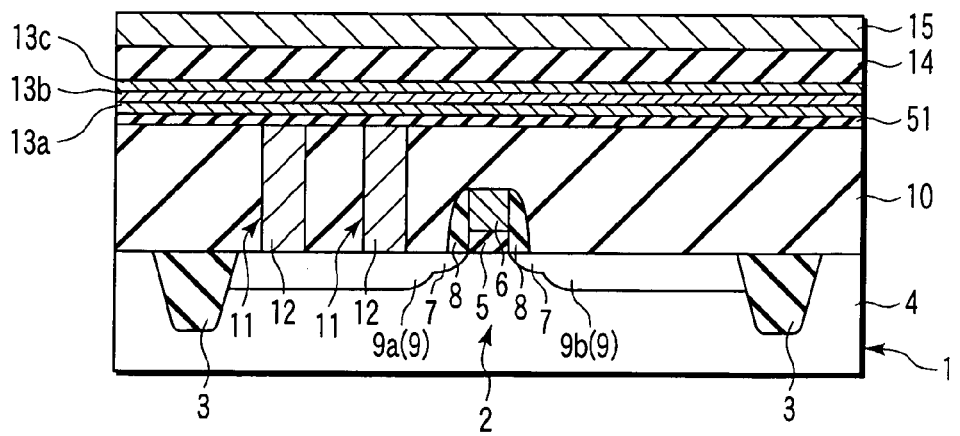
FIG. 25 is a cross-sectional process diagram that indicates the manufacturing method of the semiconductor device according to the sixth embodiment.

Next, as shown in FIG. 25, to cover the surface of the first hydrogen barrier film 51 composed of the aluminum oxide film is provided. In the present embodiment, the first hydrogen barrier film 51 is accumulated on the surface of the first layer interlayer insulation film 10 until the film thickness becomes about 2.5 nm. Continuously, to cover the surface of the first hydrogen barrier film 51, Ti/Ir film 13a, IrO$_2$ film 13b, and Pt film 13c which form the lower electrode 13, the SBT film 14 which serves as the capacitor insulation film, and the SrRuO$_3$/Pt film (SrRuO$_3$/IrOx film) 15 which serves as the upper electrode are successively stacked and provided. Consequently, in the present embodiment, same as the fourth embodiment, the first hydrogen barrier film 51 is provided between the lower electrode (Ti/Ir film 13a) and the lower electrode contact plug 12.

Figure 26:
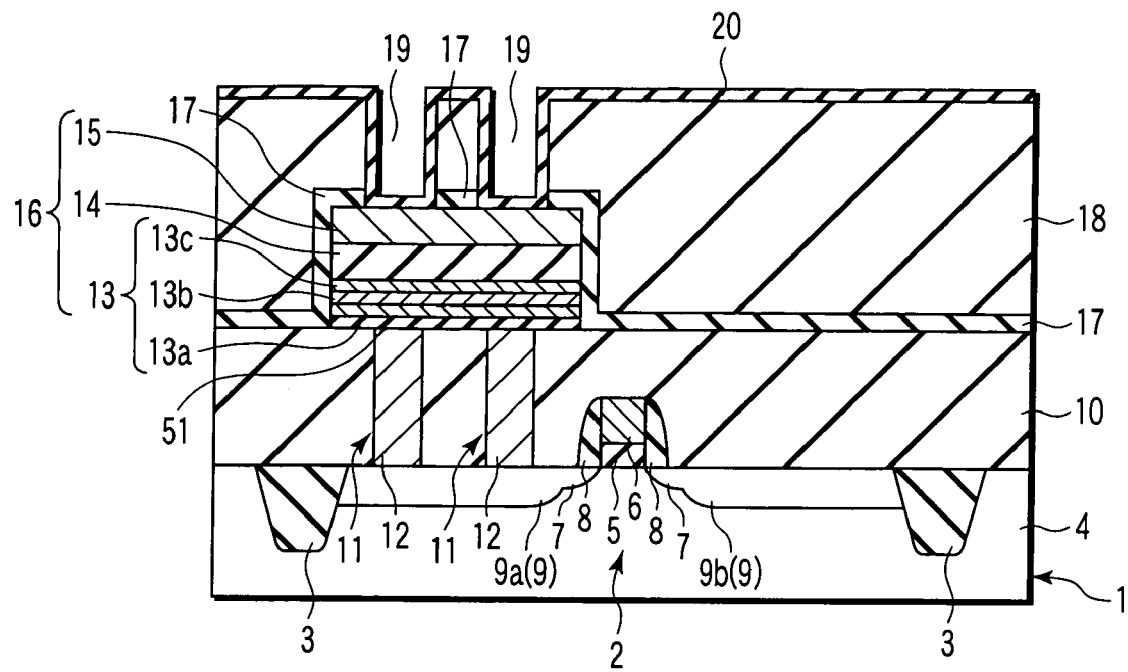
FIG. 26 is a cross-sectional process diagram that indicates the manufacturing method of the semiconductor device according to the sixth embodiment.

Next, as shown in FIG. 26, the first hydrogen barrier film 51, the lower electrode 13 (Ti/Ir film 13a, IrO$_2$ film 13b, Pt film 13c), capacitor insulation film (SBT film) 14, and upper electrode 15 (SrRuO$_3$/Pt film or SrRuO$_3$/IrOx film) are processed to be formed in the planned and predetermined shape of the ferroelectric capacitor 16 by lithography and etching. By the processes up to this point, the ferroelectric capacitor 16 formed into the desired construction is obtained as shown in FIG. 26. That is, the ferroelectric capacitor 16 formed with the capacitor insulation film (SBT film) 14 held between the lower electrode 13 (Ti/Ir film 13a, IrO$_2$ film 13b, Pt film 13c)

and the upper electrode 15 (SrRuO$_3$/Pt film or SrRuO$_3$/IrOx film) is provided above the Si substrate 1 with the lower surface of the lower electrode 13 (Ti/Ir film 13a) covered by the first hydrogen barrier film (aluminum oxide film) 51 and electrically connected to the source diffused region 9a via the first hydrogen barrier film 51 and two lower electrode contact plugs 12.

Continuously, to cover the surfaces of the first hydrogen barrier film 51, the ferroelectric capacitor 16, and the first-layer interlayer insulation film 10, the second hydrogen barrier film 17 composed of the aluminum oxide film and the second-layer interlayer insulation film 18 are provided. Thereafter, the surface of the second-layer interlayer insulation film 18 is flattened as required. Continuously, the upper electrode contact hole 19 is provided at two places by penetrating the surface of the second-layer interlayer insulation film 18 and the second hydrogen barrier film 17 along the thickness direction of these films. Thereby, the surface of the upper electrode 15 is exposed at two places. Continuously, the first hydrogen barrier film 20 composed of the aluminum oxide film is provided until the film thickness reaches about 2.5 nm to cover the inner wall surface of the upper electrode contact hole 19, the surface of the upper electrode 15 exposed by the upper electrode contact hole 19, and the surface of the second-layer interlayer insulation film 18. In this occasion as well, the first hydrogen barrier film 20 formed on the side wall surface of the contact hole 19 serves as the side-wall adsorbent member same as each of the first to fifth embodiments. Thereafter, oxygen recovery treatment is carried out once for the ferroelectric capacitor 16.

Figure 27:
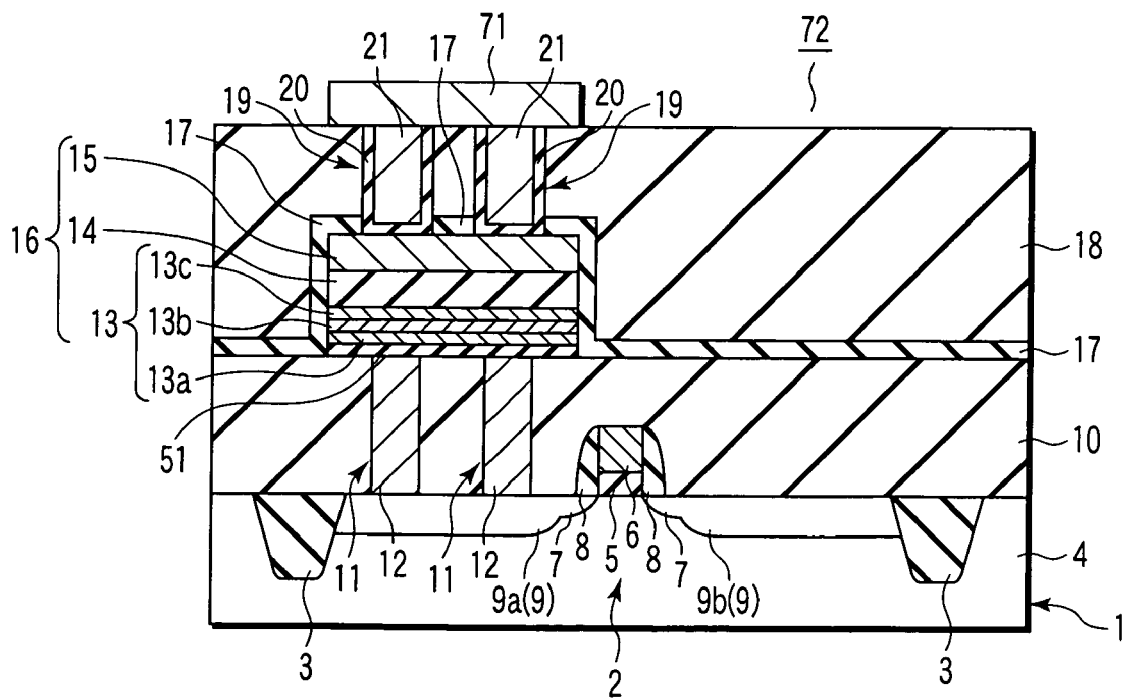
FIG. 27 is a cross-sectional process diagram that indicates the manufacturing method of the semiconductor device according to the sixth embodiment.

Next, as shown in FIG. 27, the first hydrogen barrier film 20 and the upper electrode conductor 21 are embedded in the inside of the upper electrode contact hole 19. Thereby, the two upper electrode contact plugs 21 with the side surface and the bottom surface covered with the hydrogen barrier film 20 are provided inside the second-layer interlayer insulation film 18. Each of the upper electrode contact plugs 21 of the present embodiment have the lower end portions (bottom portions) entirely brought in direct contact with the upper electrode 15 of the ferroelectric capacitor 16 via the first hydrogen barrier film 20 as is the case of the upper electrode contact plug 21 of the first embodiment. Continuously, an upper-layer wiring 71 is brought in direct contact with the upper end portion of each of the upper electrode contact plugs 21 and is provided on the surface of the second-layer interlayer insulation film 18 so that each of the upper electrode contact plugs 21 is electrically connected to each other.

Thereafter, the specific and detailed description and illustrations will be omitted, but by undergoing the planned and predetermined processes, a semiconductor device 72 according to the embodiment equipped with the desired capacitor construction shown in FIG. 27 is obtained. That is, the FeRAM 52 is obtained, which is equipped with the capacitor insulation film 14 comprising the SBT film held between the lower electrode 13 comprising three-layer stacking films of the Ti/Ir film 13a, IrO$_2$ film 13b, and Pt film 13c and the upper electrode 15 composed of SrRuO$_3$/Pt film or SrRuO$_3$/IrOx film, and is equipped with the ferroelectric capacitor 16 formed in a construction in which the lower surface of the lower electrode 13 (Ti/Ir film 13a) covered by the first hydrogen barrier film (aluminum oxide film) 51 and the lower electrode 13 and two lower electrode contact plugs 12 are indirectly electrically connected via this first hydrogen barrier film 20, and the upper electrode 15 and the two upper electrode contact plugs 21 are connected via the first hydrogen barrier film 20 in such a manner as to be electrically brought in indirect contact with each other.

As described above, according to this sixth embodiment, effects similar to those obtained by each of the first to fifth embodiments previously described can be obtained. In addition, as is the case of each of the first to fifth embodiments, providing the first hydrogen barrier films 20, 41b, 51, and 61b which are insulative materials at the connections (contact section) between the upper electrode 15 and the upper electrode contact plug 21, to the inside of the upper electrode 41, at the connections between the lower electrode 13 and the lower electrode contact plug 12, or to the inside of the lower electrode 61 may give rise to a fear of reducing plug yields at the relevant connections between the lower electrodes 13, 61 and lower electrode contact plug 12 as well as between the upper electrodes 15, 41 and the upper electrode contact plug 21, 31, and 43, respectively. For example, the plug yield at the relevant connections between the lower electrodes 13, 61 and the lower electrode contact plug 12 as well as between the upper electrodes 15, 41 and the upper electrode contact plugs 21, 31, and 43, respectively, may be reduced as compared to the plug yields at the relevant connections between the lower electrode 112 and the lower electrode contact plug 111 as well as between the upper electrode 114 and an upper electrode contact plug 117 of the FeRAM 101 related to the comparison for the FeRAM 23 of the first embodiment described above.

In order to avoid this kind of fears, as is the case of the present embodiment, the number of the lower electrode contact plugs 12 and the upper electrode contact plugs 21 is increased from one to two, respectively. Thereby, reduction of plug yields (contact yields) at the connections between the lower electrode 13 and two lower electrode contact plugs 12 and at the connections between the upper electrode 15 and two upper electrode contact plugs 21 can be suppressed or improved.

The experiments conducted by the present inventors have indicated that the FeRAM 72 according to the embodiment has the plug yields at the connections between the lower electrode 13 and two lower electrode contact plugs 12 and at the connections between the upper electrode 15 and two upper electrode contact plugs 21 improved as compared to the FeRAMs 23, 32, 44, 52, and 63 related to each of the first to fifth embodiments. That is, the FeRAM 72 according to the embodiment has the fault occurrence rate arising from plug yields reduced as compared to the FeRAMs 23, 32, 44, 52, and 63 related to each of the first and the fifth embodiments and the product yield has been improved. In addition, it has been found out that as the relevant number of the lower electrode contact plugs 12 and upper electrode contact plugs 21, that is, the number of places of connections between the lower electrode 13 and the lower electrode contact plug 12 and the number of places of connections between the upper electrode 15 and two upper electrode contact plugs 21 increase, respectively, the product yield of the FeRAM 72 can be improved.

Seventh Embodiment

Referring now to FIGS. 28 to 31, a seventh embodiment according to the invention will be described as follows. FIGS. 28 to 31 are cross-sectional process diagrams that each indicate a manufacturing method of a semiconductor device according to the embodiment. Incidentally, portions similar to those previously described with reference to the first to sixth embodiments are denoted by the same reference numerals, and their detailed descriptions will be omitted. In addition, unless otherwise predetermined, processes similar to the first embodiment will be adopted in the present embodiment.

In the present embodiment, unlike each of the first to sixth embodiments, the capacitive insulation film (capacitor insulation film) of the capacitive element and the upper electrode are formed to be smaller than the lower electrode. The lower electrode contact plug is electrically connected with the lower electrode from above the capacitive element as is the case of the upper electrode contact plug. In addition, the capacitive insulation film is formed not by SBT film but by PZT film. Now, the seventh embodiment will be described in detail as follows.

Figure 28:
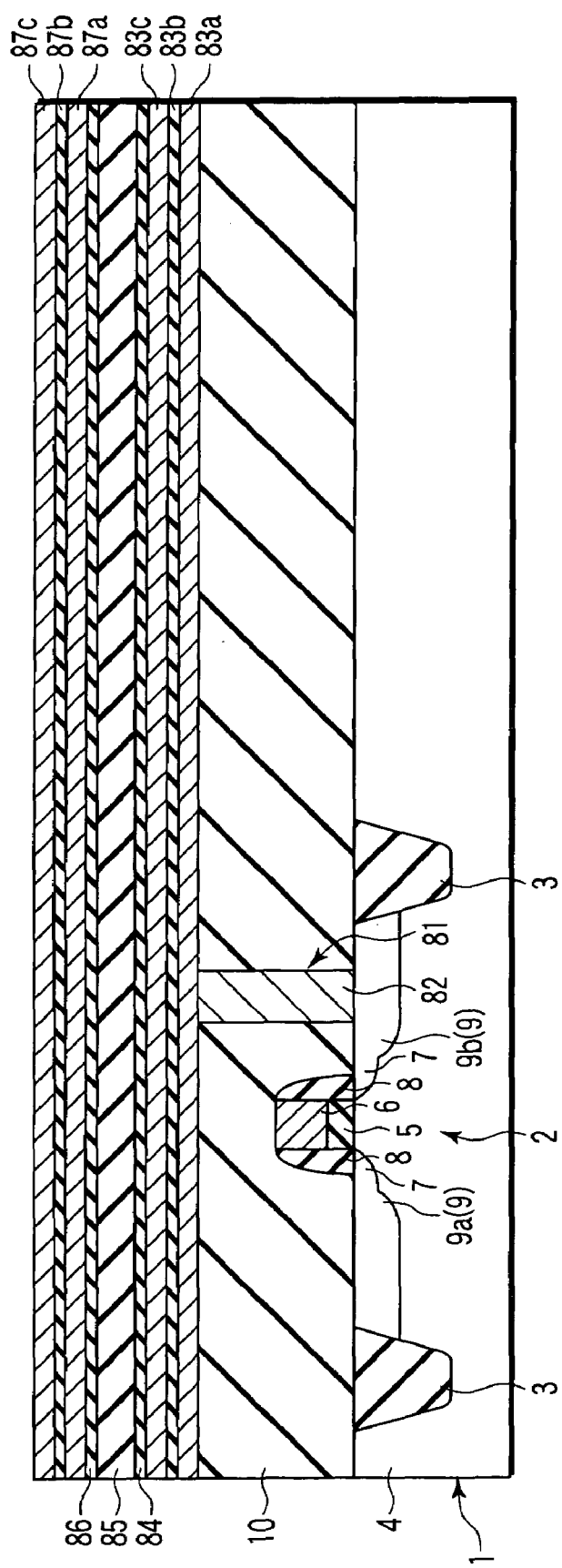
FIG. 28 is a cross-sectional process diagram that indicates a manufacturing method of a semiconductor device according to a seventh embodiment.

First of all, as shown in FIG. 28, the MOSFET 2 and the first-layer interlayer insulation film 10 are provided on the Si substrate 1. Continuously, in at least one place above the drain diffused region 9$b$ of the MOSFET 2, a first upper electrode contact hole 81 is formed in such a manner as to penetrate the first layer interlayer insulation film 10 in the film thickness direction, and the surface of the drain diffused region 9$b$ is exposed. Continuously, for example, aluminum (Al) or copper (Cu), or tungsten (W) and other conductors 82 are embedded to the inside of the first upper electrode using the CVD process, CMP process, etc. Thereby, at least one first upper electrode conductor 82 is electrically connected to the drain diffused region 9$b$, and is provided in the first-layer interlayer insulation film 10. The first upper electrode conductor 82 serves as the first upper electrode contact plug electrically connected to an upper electrode 87 of a ferroelectric capacitor 88 later discussed.

Continuously, to cover the surface of the first-layer interlayer insulation film 10 on which the first upper electrode contact plug 82 is formed, the material, which forms the ferroelectric capacitor 88, is provided. In the present embodiment, a lower electrode 83 of the ferroelectric capacitor 88 is configured from the conductor and the insulator as is the case of the fifth embodiment. Specifically, of the lower electrode 83, the portion composed by the conductor is formed into a double construction of a lower-layer side 83$a$ and an upper-layer side 83$c$. Between the lower-layer side conductor section 83$a$ and the upper-layer side conductor section 83$c$, a first hydrogen barrier film 81$b$ comprising an insulator is held to construct the lower electrode 83. Similarly, the upper electrode 87 of the ferroelectric capacitor 88 is constructed from the conductor and the insulator as is the case of the third embodiment. Specifically, the portion of the upper electrode 87 that comprises the conductor is formed into a double-layer construction of the lower-layer side 87$a$ and the upper-layer side 87$c$. Between the lower-layer side conductor section 87$a$ and the upper-layer side conductor section 87$c$, the first hydrogen barrier film 87$b$ comprising the insulator is held to compose the upper electrode 87. In addition, in the present embodiment, first hydrogen barrier films 84 and 86 are provided between the lower electrode 83 and capacitive insulation film (capacitor insulation film) 85 of the ferroelectric capacitor 88 and between the upper electrode 87 and the capacitor insulation film 85, respectively.

Consequently, first of all, to cover the surface of the first-layer interlayer insulation film 10, the lower-layer side lower electrode 83$a$, which is the lower-layer side conductor section of the lower electrode 83, is provided. Continuously, to cover the surface of the lower-layer side lower electrode 83$a$, the first hydrogen barrier film 83$b$ composed of the aluminum oxide film is provided. In this case, the first hydrogen barrier film 83$b$ is accumulated on the surface of the lower-layer side lower electrode 83$a$ until the film thickness attains about 1 nm. Continuously, to cover the surface of the first hydrogen barrier film 83$b$, the upper-layer side lower electrode 83$c$ is provided, which is the upper-layer side conductor section of the lower electrode 83. These upper-layer side upper electrode 83$c$ and the lower-layer side lower electrode 83$a$ may be formed by same material or may be formed by different materials as is the case of the upper electrode 41 of the third embodiment and the lower electrode 61 of the fifth embodiment. In the present embodiment, same as the upper electrode 41 of the third embodiment and the lower electrode 61 of the fifth embodiment, the upper-layer side lower electrode 83$c$ and the lower-layer side lower electrode 83$a$ are formed by the different materials each other. Specifically, the lower-layer side lower electrode 83$a$ is formed by Pt film. On the contrary, the upper-layer side lower electrode 83$c$ is formed by SRO/platinum (SrRuO$_3$/Pt) film or SRO/iridium oxide (SrRuO$_3$/IrOx) film.

Continuously, to cover the surface of the upper-layer side lower electrode (SrRuO$_3$/Pt film or SrRuO$_3$/IrOx film) 83$c$, a first hydrogen barrier film 84 composed of the aluminum oxide film is provided. The first hydrogen barrier film 84 on this lower electrode 83 differs from the first hydrogen barrier film in the lower electrode 83, and is accumulated on the surface of the upper-layer side lower electrode 83$c$ until the film thickness reached about 2.5 nm. Continuously, to cover the surface of the first hydrogen barrier film 84, a ferroelectric film 85 that serves as the capacitor insulation film is provided. In the present embodiment, unlike each of the first to sixth embodiments, the capacitor insulation film 85 is formed not by the use of the SBT film 14 but by the use of a PbZrXTi$_{1-x}$O$_3$ film (Pb—Zr—Ti—O film [=PZT film]). The PZT film 85 is formed by the sputtering process as is the case of the SBT film 14. Continuously, to cover the surface of the capacitor insulation film (PZT film) 85, a first hydrogen barrier film 86 composed of an aluminum oxide film is provided. The first hydrogen barrier film 86 on the capacitor insulation film 85 is accumulated on the surface of the capacitor insulation film 85 until the film thickness attains about 2.5 nm.

Continuously, to cover the surface of the first hydrogen barrier film 86, of the upper electrode 87, the lower-layer side upper electrode 87$a$, which is the lower-layer side conductor section, is provided. Continuously, to cover the surface of the lower-layer side upper electrode 87$a$, the first hydrogen barrier film 87$b$ composed of the aluminum oxide film is provided. This first hydrogen barrier film 87$b$ is accumulated on the surface of the lower-layer side upper electrode 87$a$ until the film thickness reaches about 1 nm as is the case of the first hydrogen barrier film 83$b$ in the lower electrode 83. Continuously, to cover the first hydrogen barrier film 87$b$, the upper-layer side upper electrode 87$c$, which is the upper-layer side conductor section of the upper electrode 87, is provided. These the upper-layer side upper electrode 87$c$ and the lower-layer side upper electrode 87$a$ may be formed with the same material or may be formed by different materials as is the case of the lower electrode 83, the upper electrode 41 of the third embodiment, and the lower electrode 61 of the fifth embodiment. In the present embodiment, same as the lower electrode 83, the upper electrode 41 of the third embodiment, and the lower electrode 61 of the fifth embodiment, the upper-layer side upper electrode 87$c$ and the lower-layer side upper electrode 87$a$ are formed by the different materials each other. Specifically, the lower-layer side lower electrode 87$a$ is formed by Pt film. On the contrary, the upper-layer side lower electrode 87$c$ is formed by SRO/platinum (SrRuO$_3$/Pt) film or SRO/iridium oxide (SrRuO$_3$/IrOx) film.

Figure 29:
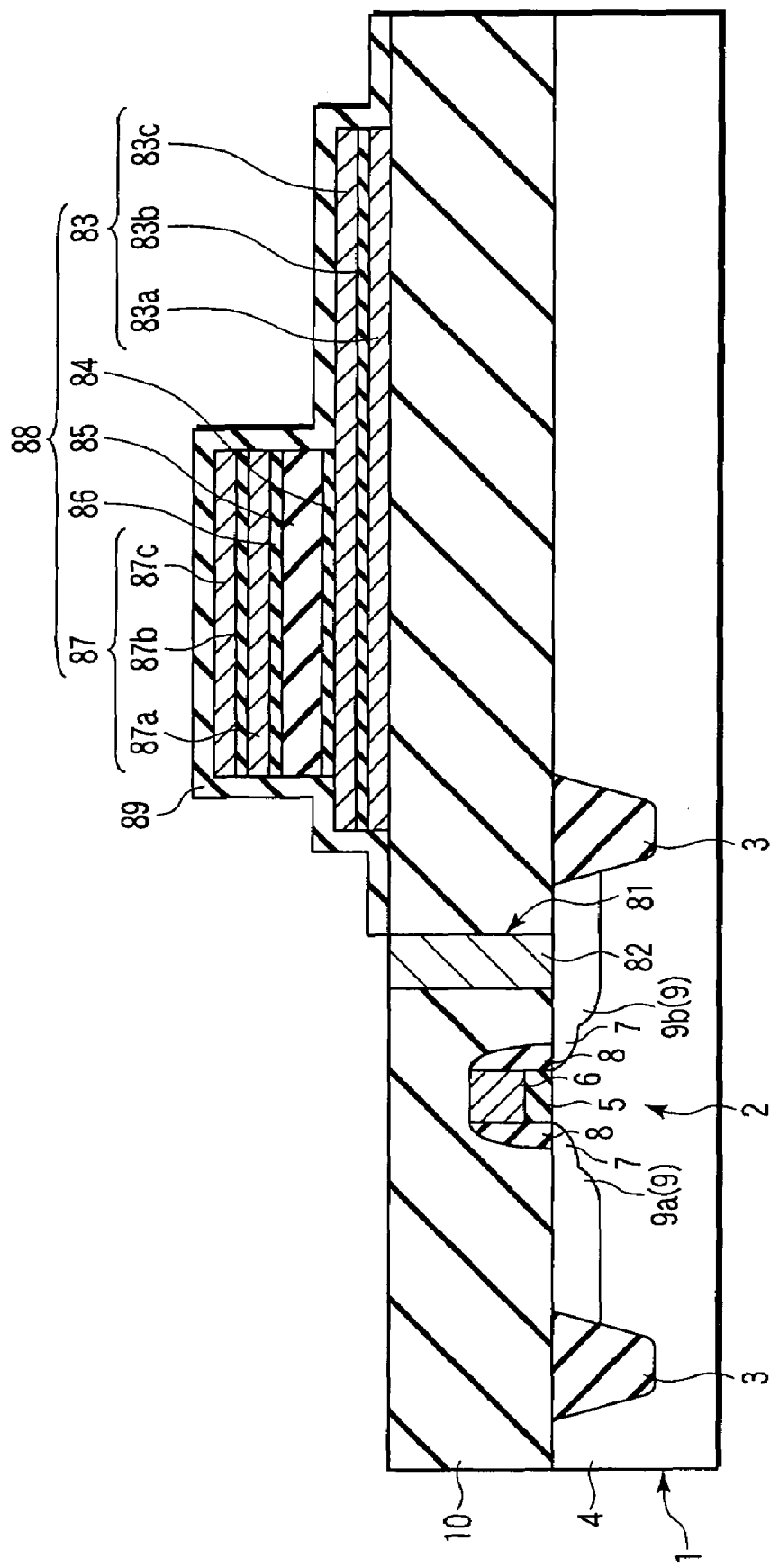
FIG. 29 is a cross-sectional process diagram that indicates the manufacturing method of the semiconductor device according to the seventh embodiment.

Next, as shown in FIG. 29, the lower electrode (lower-layer side lower electrode 83$a$, first hydrogen barrier film 83$b$, and upper-layer side lower electrode 83$c$), first hydrogen barrier film 84, capacitor insulation film (PZT film) 85, first hydrogen barrier film 86, and the upper electrode 87 (the lower-layer side upper electrode 87$a$, the first hydrogen barrier film 87b, the upper-layer side upper electrode 87c) are processed to be formed in the planned and predetermined shape of the ferroelectric capacitor 88 by lithography and etching. Specifically, as shown in FIG. 29, the lower electrode 83 provided throughout the surface of the first layer interlayer insulation film 10, first hydrogen barrier film 84, capacitor insulation film 85, first hydrogen barrier film 86, and the upper electrode 87 are formed to be small so that the surface of the first upper electrode contact plug 82 is exposed even when they are covered by a second hydrogen barrier film 89. At the same time, unlike each of the first to sixth embodiments, the first hydrogen barrier film 84, capacitor insulation film 85, first hydrogen barrier film 86, and the upper electrode 87 are formed to be smaller than the lower electrode 83.

By the processes up to this point, the ferroelectric capacitor 88 formed into the desired construction is obtained as shown in FIG. 29. That is, the ferroelectric capacitor 88 has the lower electrode 83 which is formed in the construction similar to the lower electrode 61 of the ferroelectric capacitor 62 which the FeRAM 63 of the fifth embodiment is equipped with, the upper electrode 87 which has the same construction as the upper electrode 41 of the ferroelectric capacitor 42 which the FeRAM 44 of the third embodiment is equipped with, and the first hydrogen barrier films 84 and 86 are held between the lower electrode 83 and the upper electrode 87 and the capacitor insulation film 85 comprising the PZT film, the first hydrogen barrier 84, capacitor insulation film 85, first hydrogen barrier film 86, and the upper electrode 87 are formed to be smaller than the lower electrode 83. Specifically, between the lower electrode 83 formed in a three-layer construction of the lower-layer side lower electrode (Pt film) 83a, the first hydrogen barrier film (aluminum oxide film) 83b, and the upper-layer side lower electrode (SrRuO₃/Pt film or SrRuO₃/IrOx film) 83c, the first hydrogen barrier film 84 is provided, and between the upper electrode 87 formed in a three-layer construction of the lower-layer side upper electrode (Pt film) 87a, the first hydrogen barrier film 87b, and the upper-layer side upper electrode (SrRuO₃/Pt film or SrRuO₃/IrOx film) 87c and the capacitor insulation film 85, the first hydrogen barrier film 86 is provided. In addition, the first hydrogen barrier film 84, capacitor insulation film 85, first hydrogen barrier film 86, and the upper electrode 87 are formed to be smaller than the lower electrode 83 is provided above the Si substrate 1.

Continuously, to cover the surfaces of the ferroelectric capacitor 88 and the first-layer interlayer insulation film 10, the second hydrogen barrier film 89 composed of the aluminum oxide films is provided. Continuously, the second hydrogen barrier film 89 is formed to be small by etching until the surface of the first upper electrode contact plug 82 is exposed.

Figure 30:
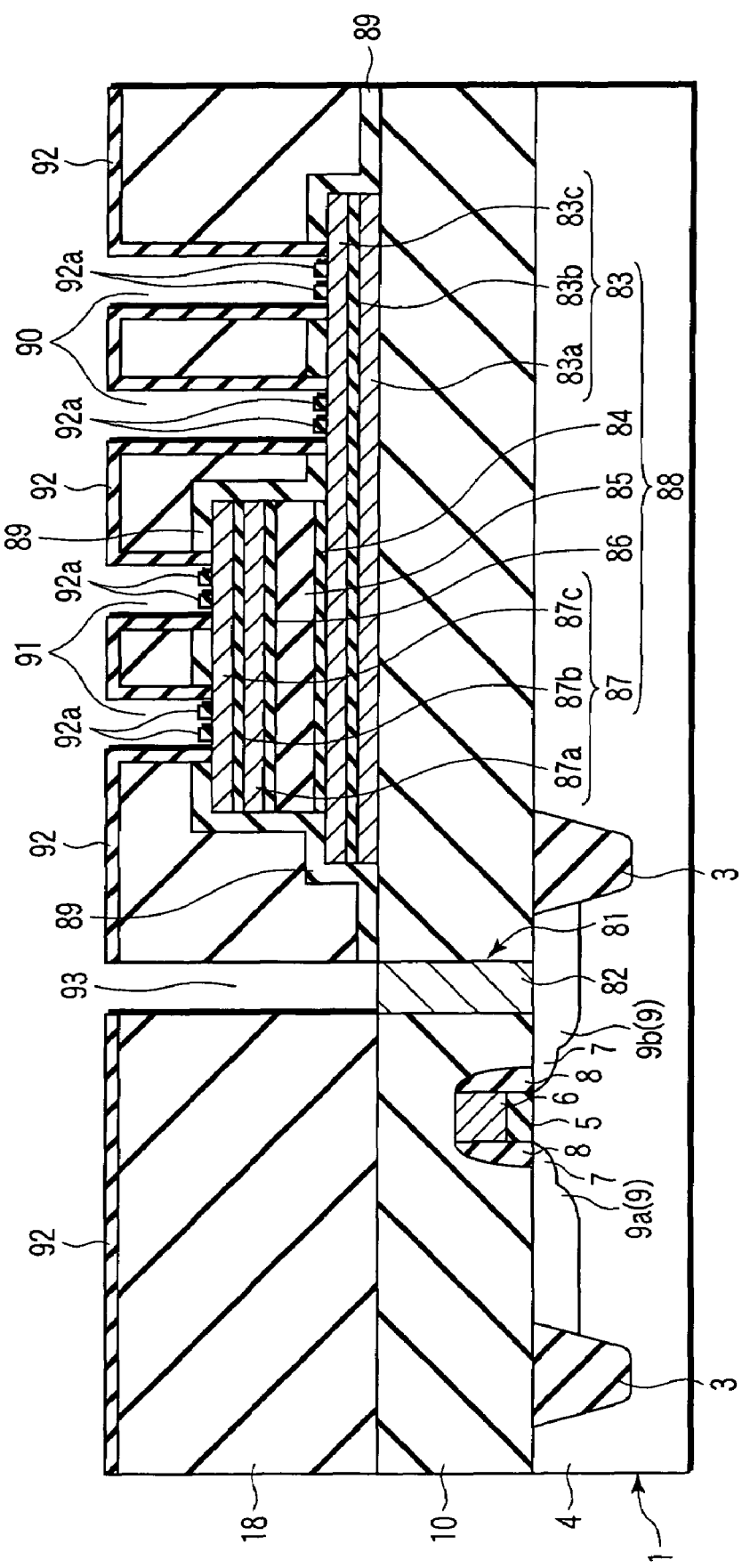
FIG. 30 is a cross-sectional process diagram that indicates the manufacturing method of the semiconductor device according to the seventh embodiment.

Next, as shown in FIG. 30, to cover the surfaces of the ferroelectric capacitor 88 covered with the second hydrogen barrier film 89 and of the first-layer interlayer insulation film 10 with the surface of the first upper electrode contact plug 82 is exposed, the second-layer interlayer insulation film 18 is provided. Thereafter, the surface of the second-layer interlayer insulation film 18 is flattened as required. Continuously, at the position where the capacitor insulation film 85 of the upper electrode 87, etc. are not overlapped above the lower electrode 83, two lower electrode contact holes 90 are provided by penetrating the surface of the second-layer interlayer insulation film 18 and the second hydrogen barrier film 89 along the thickness direction of these films. Thereby, the surfaces of the lower electrode 83 are exposed at two places. In the similar manner, at the position where the capacitor insulation film 85 of the upper electrode 87, etc. are not overlapped above the lower electrode 83, two lower electrode contact holes 90 are provided by penetrating the surface of the second-layer interlayer insulation film 18 and the second hydrogen barrier film 89 along the thickness direction of these films. Thereby, the surfaces of the lower electrode 87 are exposed at two places.

Continuously, to cover the inner wall surface of each of the lower electrode contact holes 90, the surface of the lower electrode 83 (the upper-layer side lower electrode 83c), the inner wall surfaces of each of the second upper electrode contact holes 91, the surface of the upper electrode 87 (the upper-layer side upper electrode 87c) exposed by each of the second upper electrode contact holes 91, and the surface of the second-layer interlayer insulation film 18, the first hydrogen barrier film 92 composed of the aluminum oxide film is provided until the film thickness reaches about 5 nm. In this case as well, the first hydrogen barrier film 92 formed on the side wall surface of each of the lower electrode contact hole 90 and on the side wall surface of each of the second upper electrode contact holes 91 serve as the side-wall adsorbent member as is the case of each of the first to fifth embodiments.

Continuously, by the process same as the second embodiment, the first hydrogen barrier films (remaining films) 92, 92a which are left inside of each of the lower electrode contact holes 90 are formed into dense and homogeneous thin film shape that entirely covers the inner wall surfaces of each of the lower electrode contact holes 90, and on the bottom surface (surface of the lower electrode 83) of each of the lower electrode contact holes 19, the first hydrogen barrier films are formed into sparse and nonhomogeneous thin film shape which partially covers the bottom surface. In the same manner, the first hydrogen barrier films 92, 92a which are left in each of the second upper electrode contact holes 91 are formed into dense and homogeneous thin film shape that entirely covers the inner wall surfaces of each of upper electrode contact holes 91, and on the bottom surface (surface of the upper electrode 87) of each of the second upper electrode contact holes 19, the first hydrogen barrier films are formed into sparse and nonhomogeneous thin film shape which partially covers the bottom surface.

Specifically, on the inner wall surface of each of the lower electrode contact holes 90, the first hydrogen barrier film 92 about 5 nm in film thickness is left substantially as it is in the form of homogeneous thin film which has uniform film thickness. As against this, on the bottom surface of each of the lower electrode contact holes 90, multiple holes are provided in the first hydrogen barrier film 92 to partially expose the bottom surface, and the first hydrogen barrier film 92a has the film thickness reduced from about 5 nm to about 2.5 nm, and is formed into non-uniform thin film shape first hydrogen barrier film 92a and is left. In the same manner, on the inner wall surface of each of the second upper electrode contact hole 91, the first hydrogen barrier film 92 about 5 nm in film thickness is left substantially as it is in the form of homogeneous thin film which has uniform film thickness in such a manner as to cover entirely the inner wall surface. As against this, on the bottom surface of each of the second upper electrode contact holes 91, multiple holes are provided in the first hydrogen barrier film 92a to partially expose the bottom surface, and the first hydrogen barrier film 92a has the film thickness reduced from about 5 nm to about 2.5 nm, and is formed into non-uniform thin film shape first hydrogen barrier film 92a and is left. Thereafter, oxygen recovery heat treatment is carried out once for the ferroelectric capacitor 88.

In addition, in at least one place above the first upper electrode contact plug 82, a third upper electrode contact hole 93 is opened to penetrate the first hydrogen barrier film 92 and the second layer interlayer insulation film 18 along the thickness direction of these films. Thereby, the surface of the first upper electrode contact plug 82 is exposed at least in one place. The third upper electrode contact hole 93 may be formed when the above-mentioned first hydrogen barrier films 92, 92*a* are processed to be formed or before or after the processing.

Figure 31:
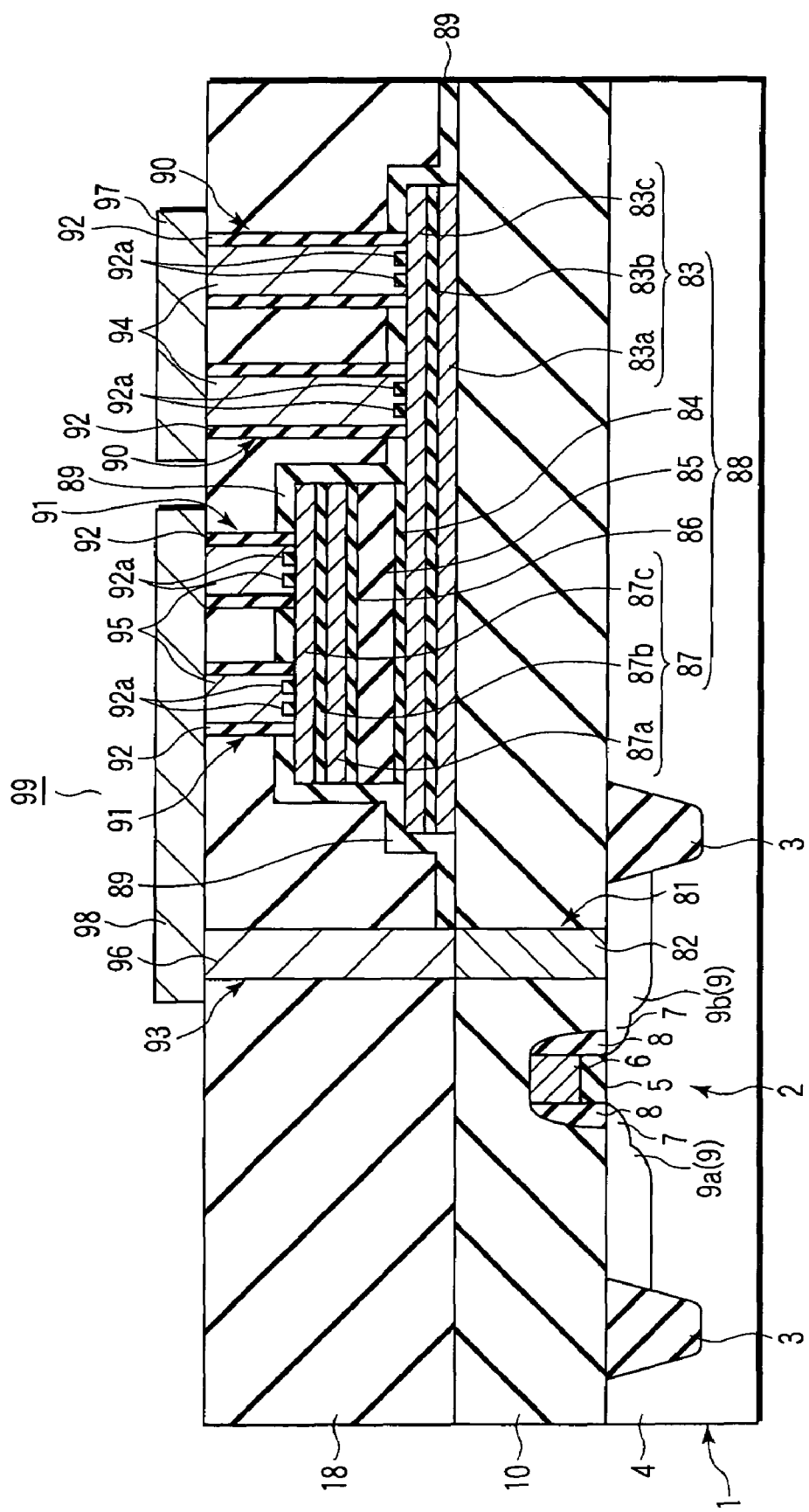
FIG. 31 is a cross-sectional process diagram that indicates the manufacturing method of the semiconductor device according to the seventh embodiment.

Next, as shown in FIG. 31, in the inside of each of the lower electrode contact hole 90, a lower electrode conductor 94 is embedded together with the first hydrogen barrier films 92, 92*a*. Thereby, same as the upper electrode contact plug 31 of the second embodiment, two lower electrode contact plugs 94, the side surfaces of which are covered with the first hydrogen barrier film 92, and the lower end portion (bottom portion) of which partially makes direct contact with the surface of the lower electrode 83 (the upper-layer side lower electrode 83*c*) of the ferroelectric capacitor 88 are provided in the second-layer interlayer insulation film 18. That is, in the present embodiment, unlike each of the first to sixth embodiments, each of the lower electrode contact plug 94 is provided while it is electrically connected to the lower electrode 83 from above the lower electrode 83.

In addition, in the inside of each of the second upper electrode contact holes 91, a second upper electrode conductor 95 is embedded together with the first hydrogen barrier films 92, 92*a*. Thereby, the side surfaces are covered with the first hydrogen barrier film 92, and two second upper electrode contact plugs (upper electrode conductor) 95, the lower end portions (bottom portion, bottom surface) of which partially make direct contact with the upper electrode 87 (the upper-layer side upper electrode 87*c*) of the ferroelectric capacitor 88 are provided inside the second-layer interlayer insulation film 18.

Furthermore, a third upper electrode conductor 96 is singularly embedded inside the third upper electrode contact hole 93. Thereby, at least one third upper electrode contact plug (upper electrode conductor) 96 which directly comes in contact with the surface (upper surface) of the first upper electrode contact plug 82 is provided inside the second-layer interlayer insulation film 18.

Continuously, a lower electrode upper-layer wiring 97 is brought in direct contact with the upper end portion of each of the lower electrode contact plugs 94 and is provided on the surface of the second-layer interlayer insulation film 18. Similarly, an upper electrode upper-layer wiring 98 is brought in direct contact with the upper end portion of each of the second upper electrode contact plugs 95 as well as the upper end portion of the third upper electrode contact plug 96 and provided on the surface of the second-layer interlayer insulation film 18. Thereby, the upper electrode 87 of the ferroelectric capacitor 88 is electrically connected to the drain diffused region 9*b* of the MOSFET 2 via each of the first to third upper electrode contact plugs 82, 95, and 96 as well as the upper electrode upper-layer wiring 98. Thereafter, specific and detailed descriptions and illustrations are omitted but by undergoing the planned and predetermined processes, a semiconductor device 99 according to the embodiment equipped with the desired capacitor construction shown in FIG. 31 is obtained. That is, the FeRAM 99 is obtained, which is formed in the construction with the capacitor insulation film 85 comprising the PZT film, the main surface on the lower electrode 83 side and the main surface of the upper electrode 87 of which are covered with aluminum oxide films 84, 86 held between the lower electrode 83 comprising three-layer stacking films of Pt film 83*a*, aluminum oxide film 83*b*, and SrRuO$_3$/Pt film (SrRuO$_3$/IrOx film) 83*c* and the upper electrode 87 comprising three-layer stacking films of Pt film 87*a*, aluminum oxide film 87*b*, and SrRuO$_3$/Pt film (SrRuO$_3$/IrOx film) 87*c*, and is equipped with the ferroelectric capacitor 88 formed in a construction in which the upper surface of the lower electrode 83 (SrRuO$_3$/Pt film or SrRuO$_3$/IrOx film 83*c*) and the lower surfaces of two lower electrode contact plugs 94 are partially, electrically, and directly connected, and the upper surface of the upper electrode 87 (SrRuO$_3$/Pt film or SrRuO$_3$/IrOx film 87*c*) and the lower surface of the second upper electrode contact plug 95 are partially, electrically, and directly connected, and the upper electrode 87 is electrically connected to the drain diffused region 9*b* of the MOSFET 2 via each of the first to third upper electrode contact plugs 82, 95, and 96 as well as the upper electrode upper-layer wiring 98.

As described above, according to the seventh embodiment, effects similar to those obtained by each of the first to sixth embodiments previously described can be obtained.

By the way, the semiconductor device according to the invention and its manufacturing method are not restricted by each of the first to seventh embodiments mentioned above. The invention may be embodied by changing part of the configurations or the manufacturing processes, etc. into various settings or combining various settings appropriately and properly without departing from the spirit and scope thereof.

For example, the materials which form the first hydrogen barrier films 20, 41*b*, 51, 61*b*, 83*b*, 84, 86, 87*b*, 92, and the second hydrogen barrier films 17, 89 shall not be limited to aluminum oxides (Al$_x$—O$_y$) such as alumina (Al$_2$O$_3$) described above. They may be formed at least by the material, which adsorbs (captures, blocks) hydrogen. Examples of such material other than aluminum oxides include zirconium oxides (Zr$_x$—O$_y$), aluminum silicon oxides (Al$_x$—Si$_y$—O$_z$), titanium oxides (Ti$_x$—O$_y$), aluminum nitrides (Zr$_x$—N$_y$), silicon nitrides (Si$_x$—N$_y$), etc. Or the material, which contains at least one kind of the substance of these substances, or the material, which contains compounds or mixture combining at least two kinds of each of these substances, may be used.

In addition, the film thickness of the first hydrogen barrier films 20, 41*b*, 51, 61*b*, 83*b*, 84, 86, 87*b*, and 92 as well as the second hydrogen barrier films 17 and 89 shall not be limited to the above-mentioned film thicknesses. For example, the film thickness of the first hydrogen barrier films 20, 41*b*, 51, 61*b*, 83*b*, 84, 86, 87*b*, and 92 as well as the second hydrogen barrier films 17 and 89 may have the thickness in which all atoms that compose the films form at least one layer and are arranged.

In addition, the ferroelectric film (ferroelectric material) used for the capacitor insulation film shall not be limited to the above-mentioned PZT film or SBT film. In place of these PZT films or SBT films, for example, Pb$_{1-x}$La$_x$Zr$_x$Ti$_{1-x}$O$_3$ (Pb—La—Zr—Ti—O: PLZT) films, SrTiO$_3$ (Sr—Ti—O: STO) films, PbZnO$_3$ (Pb—Zn—O: PZ) films, or BaTiO$_3$ films, Bi$_4$Ti$_3$O$_{12}$ films ad other BaTiO$_3$ (Ba—Ti—O: BT) films may be used. In addition, they are not ferroelectric films but high relative dielectric constant film such as Ta$_2$O$_5$ films, Ba$_x$Sr$_{1-x}$TiO$_3$ (Ba—Sr—Ti—O: BST) films, and others may be used.

In addition, in the second embodiment, the first hydrogen barrier film 20 mounted between the upper electrode 15 and the upper electrode contact plug 31 is formed into a sparse and non-uniform thin film shape with a larger amount of film 20 which remain on the upper electrode 15 than the amount of holes formed on the film, but it is not limited to this. For example, the first hydrogen barrier film 20 provided between the upper electrode 15 and the upper electrode contact plug 31 may be formed in such a manner as to be dotted on the upper electrode 15. Specifically, of the surfaces (upper surfaces) of the upper electrode 15, the area of the portion covered by the first hydrogen barrier film 20 is processed in island shapes (granules) so that the area is smaller than the area of the exposed portion, which is not covered by the first hydrogen barrier film and left on the upper electrode 15. Or the first hydrogen barrier film may be formed in the porous state not by dry etching (anisotropic etching) but wet etching (isotropic etching) and may be left on the upper electrode 15. That is, the amount and film thickness of the first hydrogen barrier film 20 provided between the upper electrode 15 and the upper electrode contact plug 31, and the coverage, etc. of the surface of the upper electrode 15 by the first hydrogen barrier film 20 may be set to the size that enables adsorption (capture, block) of hydrogen that comes close to the capacitor insulation film 14 from the connections at least between the upper electrode 15 and the upper electrode contact plug 31. This kind of setting can be applied to the first hydrogen barrier film 92 of the seventh embodiment in the similar manner.

In addition, in each of the third and the fifth embodiment, the first hydrogen barrier films 41b, 61b may be formed not in the dense and homogeneous thin-film shape but in the sparse and non-uniform thin-film shape as is the case of the first hydrogen barrier film 20 of the second embodiment. Thereby, the current inside the upper electrode 41 and lower electrode 61 is allowed to flow smoothly and electric characteristics of ferroelectric capacitors 44, 63 can be improved. In short, the first hydrogen barrier film 41b provided inside the upper electrode 41 or the first hydrogen barrier film 61b provided inside the lower electrode 61 are sufficient to be set to the condition that can adsorb (captures, blocks) the hydrogen which invades the inside of at least upper electrode 41 and lower electrode 61. This kind of setting may be applied in the similar manner to the first hydrogen barrier films 51, 83b, 84, 86, and 87b in each of the fourth, the sixth, and the seventh embodiments.

In addition, the configuration to provide the first hydrogen barrier films 20, 41b on the surface or the inside of the upper electrodes 15, 41 as in the case of each one of the first to third embodiments may be additionally applied to the configuration to provide the first hydrogen barrier films 51, 41b on the back surface or the inside of the lower electrodes 13, 61 as in the case of each one of the fourth and the fifth embodiments. In this case, the reliability, performance, quality, product yields, etc. of the FeRAMs 52, 63 of each one of the fourth and the fifth embodiments can be still more improved. Similarly, needless to say, additionally adding the configuration of each one of the first to third embodiments to the configuration of each one of the fourth and the fifth embodiments can further improve the reliability, performance, quality, product yield, etc. of the FeRAMs 23, 32, 44 of each one of the first to third embodiments.

In addition, in the ferroelectric capacitor 88 which the FeRAM 99 of the seventh embodiment is equipped, to the back surface of the lower electrode 83 (lower-layer side lower electrode 83a), no lower electrode contact plug is connected. However, even in this kind of construction as well, needless to say, it is no problem to provide the first hydrogen barrier film to the back surface (bottom surface) of the lower electrode 83. In this case, degradation of the capacitor insulation film 85 can be still more suppressed or reduced. By the way, in the case where the first hydrogen barrier films 20, 51, 83b, 84, 86, 87b are provided in multiple places as in the case of each of the sixth and the seventh embodiments, the first hydrogen barrier film formed in dense and uniform thin film shape like the first hydrogen barrier film 20 of the first embodiment may be mixed with the first hydrogen barrier film formed in sparse and non-uniform thin film shape like the first hydrogen barrier film 20 of the second embodiment.

In addition, in the case where the conductor portion of the lower electrode or the upper electrode of the capacitor is formed by dividing in a plurality of layers, the number of stacks (number of divisions) may not always be divided in upper and lower two layers as is the case of the upper electrode 41 of the third embodiment, the lower electrode 61 of the fifth embodiment, or the lower electrode 83 and the upper electrode 87 of the seventh embodiment. The conductor portion of the lower electrode or the upper electrode of the capacitor may be formed by dividing into three or more layers. In this case, each conductor portion may be all formed by the same material or all formed by different materials. In addition, in such a case, there is no need to provide the first hydrogen barrier layer between all the adjacent conductor portions. The first hydrogen barrier layer should be provided between the predetermined conductor portions of all the conductor portions. Furthermore, in the case where the first hydrogen barrier film is provided in a plurality of portions inside the electrode, it is needless to say that the first hydrogen barrier film formed in dense and uniform thin film shape like the first hydrogen barrier film 20 of the first embodiment may be mixed with the first hydrogen barrier film formed in sparse and non-uniform thin film shape like the first hydrogen barrier film 20 of the second embodiment.

In addition, the number of the lower electrode contact plugs 12 connected to the lower electrode 13 of the ferroelectric capacitor 16 which the FeRAM 72 of the sixth embodiment is equipped with shall not be limited to two pieces. It is needless to say that the number of the lower electrode contact plugs 12 connected to the lower electrode 13 may be set to 3 or more pieces. In the similar manner, the number of the upper electrode contact plugs 21 connected to the upper electrode 15 of the ferroelectric capacitor 16 which the FeRAM 72 is equipped with shall not be limited to two pieces. It is needless to say that the number of the upper electrode contact plugs 21 connected to the upper electrode 15 may be set to 3 or more pieces. In addition, it is not necessary to set the numbers of the lower electrode contact plug 12 and the upper electrode contact plugs 21 to the same numbers. The lower electrode contact plug 12 and the upper electrode contact plug 21 may be set to the number of pieces different from each other.

Naturally, this kind of setting can be applied to the FeRAM 99 of the seventh embodiment in the similar manner. That is, the number of the lower electrode contact plugs 94 connected to the lower electrode 83 of the ferroelectric capacitor 88 which the FeRAM 99 of the seventh embodiment is equipped with shall not be limited to two pieces. It is a matter of course that the number of second upper electrode contact plugs 95 connected to the upper electrode 87 may be set to 3 or more. Likewise, the number of second upper electrode plugs 95 connected to the upper electrode 87 of the ferroelectric capacitor 88 which FeRAM 99 is equipped with shall not be limited to two. It is a matter of course that the number of second upper electrode contact plugs 95 connected to the upper electrode 87 may be set to three or more. Or, in the FeRAM 99, it is a matter of course to set the number of the lower electrode contact plugs 94 connected to the lower electrode 83 and the number of the second upper electrode contact plugs 95 connected to the upper electrode 87 to one piece each. Furthermore, there is no need to set the number of the lower electrode contact plugs 94 and the number of the second upper electrode contact plugs 95 to the same number. The lower electrode contact plug 94 and the second upper electrode contact plug 95 may be set to the number of pieces different from each other.

In addition, the above-mentioned setting can be applied to the FeRAMs 23, 32, 44, 52, and 63 of each of the first to fifth embodiments. That is, the number of the lower electrode contact plug 12 connected to the FeRAM 23, 32, 44, 52, and 63 shall not be limited to one piece. It is needless to say that the number of the lower electrode contact plugs 12 connected to the lower electrodes 13, 61 may be set to two or more. Similarly, the number of pieces of the upper electrode contact plugs 21, 31, and 43 connected to the upper electrodes 15, 41 of the FeRAMs 23, 32, 44, 52, and 63 shall not be limited to one. It is a matter of course that the number of pieces of the upper electrode contact plugs 21, 31, and 43 connected to the upper electrodes 15, 41 of the FeRAMs 23, 32, 44, 52, and 63 may be two or more. In addition, the number of the lower electrode contact plugs 12 may not be set to same number of pieces of the upper electrode contact plugs 21, 31, and 43. The lower electrode contact plug 12 and the upper electrode contact plugs 21, 31, and 43 may be set to the number of pieces different from each other.

In addition, the material to form the lower electrodes 13, 61, and 83 or upper electrodes 15, 41, or 87 shall not be limited to the Ti/Ir film, $IrO_2$ film, $SrRuO_3$/Pt film, or $SrRuO_3$/IrOx film. In place of these materials (films), for example, Ru films RuOx films, and other ruthenium (Ru) based materials may be used. What is important is to form lower electrodes 13, 61, and 83 and upper electrodes 15, 41, and 87 using materials difficult to degrade ferroelectric films 14 and 85 even when the ferroelectric films 14 and 85 which are capacitor insulation films come in contact with lower electrodes 13, 61, or 83 or the upper electrodes 15, 41, 87.

Furthermore, the configuration described above can be applied to DRAM (dynamic random access memory) as well, in which the capacitor insulation film is formed by insulation films with regular relative dielectric constant, such as $SiO_2$, etc. In this case as well, it is possible to suppress or reduce degradation of capacitor insulation film due to hydrogen. As a result, it is possible to suppress or reduce fears of degrading the performance, reliability, quality, etc. of the whole DRAM. That is, applying the present invention to DRAM can achieve the effects same as those obtained with the FeRAMs 23, 32, 44, 52, 63, 72, and 99 according to the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a capacitive element which is provided above a semiconductor substrate and which has a capacitive insulation film held between an upper electrode and a lower electrode;
   a conductor for upper electrode which is connected to the upper electrode;
   a side-wall adsorbent member which covers a side wall of the conductor for upper electrode and which is composed of a material that adsorbs at least hydrogen;
   a conductor for lower electrode which is connected to the lower electrode; and
   a first adsorbent member which is provided at least either between the conductor for upper electrode and the capacitive insulation film or between the conductor for lower electrode and the capacitive insulation film, which is composed of a material that adsorbs at least hydrogen, which is composed of an insulator, and which has a thickness that permits a tunnel current to flow therein.

2. The semiconductor device according to claim 1, wherein the first adsorbent member is provided at least at one place of between the conductor for upper electrode and the upper electrode, inside the upper electrode, between the upper electrode and the capacitive insulation film, between the capacitive insulation film and the lower electrode, inside the lower electrode, and between the lower electrode and the conductor for lower electrode.

3. The semiconductor device according to claim 1, wherein the first adsorbent member is composed of a material including at least one kind of aluminum oxide, zirconium oxide, aluminum silicon oxide, titanium oxide, aluminum nitride, zirconium nitride, and silicon nitride.

4. The semiconductor device according to claim 1, wherein the side-wall adsorbent member covers the whole surface of the side wall of the conductor for upper electrode and is formed in a dense and homogeneous thin film shape with uniform film thickness.

5. The semiconductor device according to claim 1, wherein the first adsorbent member is formed to be thinner than the side-wall adsorbent member.

6. The semiconductor device according to claim 1, wherein the first adsorbent member is partially provided at least either between the conductor for upper electrode and the upper electrode or between the lower electrode and the conductor for lower electrode.

7. The semiconductor device according to claim 1, wherein the thickness of the first adsorbent member is of the size which enables tunnel current to flow either between the conductor for upper electrode and the upper electrode, inside the upper electrode, or between the lower electrode and the conductor for lower electrode.

8. The semiconductor device according to claim 1, wherein the thickness of the first adsorbent member is set such that at least one atomic layer exists.

9. The semiconductor device according to claim 1, wherein the thickness of the first adsorbent member is 5 nm or less.

10. The semiconductor device according to claim 1, wherein the capacitive insulation film is formed by a high relative dielectric constant material whose relative dielectric constant is higher than that of $SiO_2$.

11. The semiconductor device according to claim 1, wherein the capacitive insulation film is formed by a ferroelectric material.

12. A manufacturing method of a semiconductor device, comprising:
    providing a conductor for lower electrode above a semiconductor substrate;
    providing a lower electrode which connects to the conductor for lower electrode;
    providing a capacitive insulation film on the lower electrode;
    providing an upper electrode on the capacitive insulation film;
    providing a conductor for upper electrode which connects to the upper electrode;
    providing a side-wall adsorbent member which covers a side wall of the conductor for upper electrode and which is composed of a material that adsorbs at least hydrogen; and
    providing a first adsorbent member which is composed of a material that adsorbs at least hydrogen at least either between the conductor for upper electrode and the capacitive insulation film or between the conductor for lower electrode and the capacitive insulation film, wherein the first adsorbent member is composed of an insulator and has a thickness that permits a tunnel current to flow therein.

13. The method according to claim 12, further comprising:
providing a second adsorbent member which covers the upper electrode and side surfaces of the capacitive insulation film and the lower electrode, which contacts with the first adsorbent member, and which is composed of a material that adsorbs at least hydrogen.

* * * * *